United States Patent
Tanaka et al.

(10) Patent No.: US 6,591,120 B1
(45) Date of Patent: Jul. 8, 2003

(54) ROTATIONALLY SYMMETRIC OXIDE SUPERCONDUCTING WIRE AND SOLENOID COIL OR MAGNETIC FIELD GENERATOR INCORPORATING THE SAME

(75) Inventors: Kazuhide Tanaka, Hitachi (JP); Michiya Okada, Mito (JP); Keiji Fukushima, Hitachi (JP); Tsuyoshi Wakuda, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/555,222

(22) PCT Filed: Dec. 9, 1998

(86) PCT No.: PCT/JP98/05566

§ 371 (c)(1),
(2), (4) Date: May 26, 2000

(87) PCT Pub. No.: WO99/30333

PCT Pub. Date: Jun. 17, 1999

(30) Foreign Application Priority Data

Dec. 10, 1997 (JP) ............................................. 9-339630

(51) Int. Cl.⁷ .......................... H01B 12/00; H01L 39/24
(52) U.S. Cl. .......................... 505/231; 29/599; 505/705
(58) Field of Search .......................... 29/599; 505/431, 505/231, 704, 705

(56) References Cited

U.S. PATENT DOCUMENTS

| | | | |
|---|---|---|---|
| 5,340,943 A | * | 8/1994 | Sato ............................. 29/599 |
| 5,604,473 A | * | 2/1997 | Rodenbush ................. 505/705 |
| 6,192,573 B1 | * | 2/2001 | Hahakura et al. ............. 29/599 |
| 6,370,405 B1 | * | 4/2002 | Riley et al. .................. 505/231 |
| 6,442,827 B1 | * | 9/2002 | Herrmann et al. ............ 29/599 |

FOREIGN PATENT DOCUMENTS

| | | |
|---|---|---|
| JP | 9223418 | 8/1997 |

\* cited by examiner

*Primary Examiner*—David P. Bryant
(74) *Attorney, Agent, or Firm*—Antonelli, Terry, Stout & Kraus, LLP

(57) ABSTRACT

The cross section of a wire is round and is composed of several units, each consisting of tape-like superconductors laminated in an approximately rhombic shape, which are arranged such that they form a hexagon as a whole. Oxide superconducting tape wires each consisting of a plurality of oxide superconducting filaments are arranged in rotational symmetry to a core. The oxide superconducting filaments have the cross section such that the average thickness is 3 to 20 $\mu$m and the average aspect ratio is larger than 2 and smaller than 10. A step of arranging the oxide superconducting tape-like wires in rotational symmetry is accomplished when the multi-core tape-like wires are packed in a third metal pipe which becomes a metal sheath later. Since the multi-core tape wires having oxide superconducting filaments are arranged in rotational symmetry, the oxide superconductor in the oxide superconducting filaments permits its c axis to orient in various directions. This makes it possible to prevent the critical current from decreasing irrespective of the direction in which the magnetic field is applied and to increase the critical current density (Jc) because the oxide superconducting filament has an optimal size. The oxide superconductor should be a bismuth-based oxide superconductor, preferably be the one which has a composition of $Bi_2Sr_2Ca_1Cu_2O_x$.

17 Claims, 21 Drawing Sheets

F I G. 2
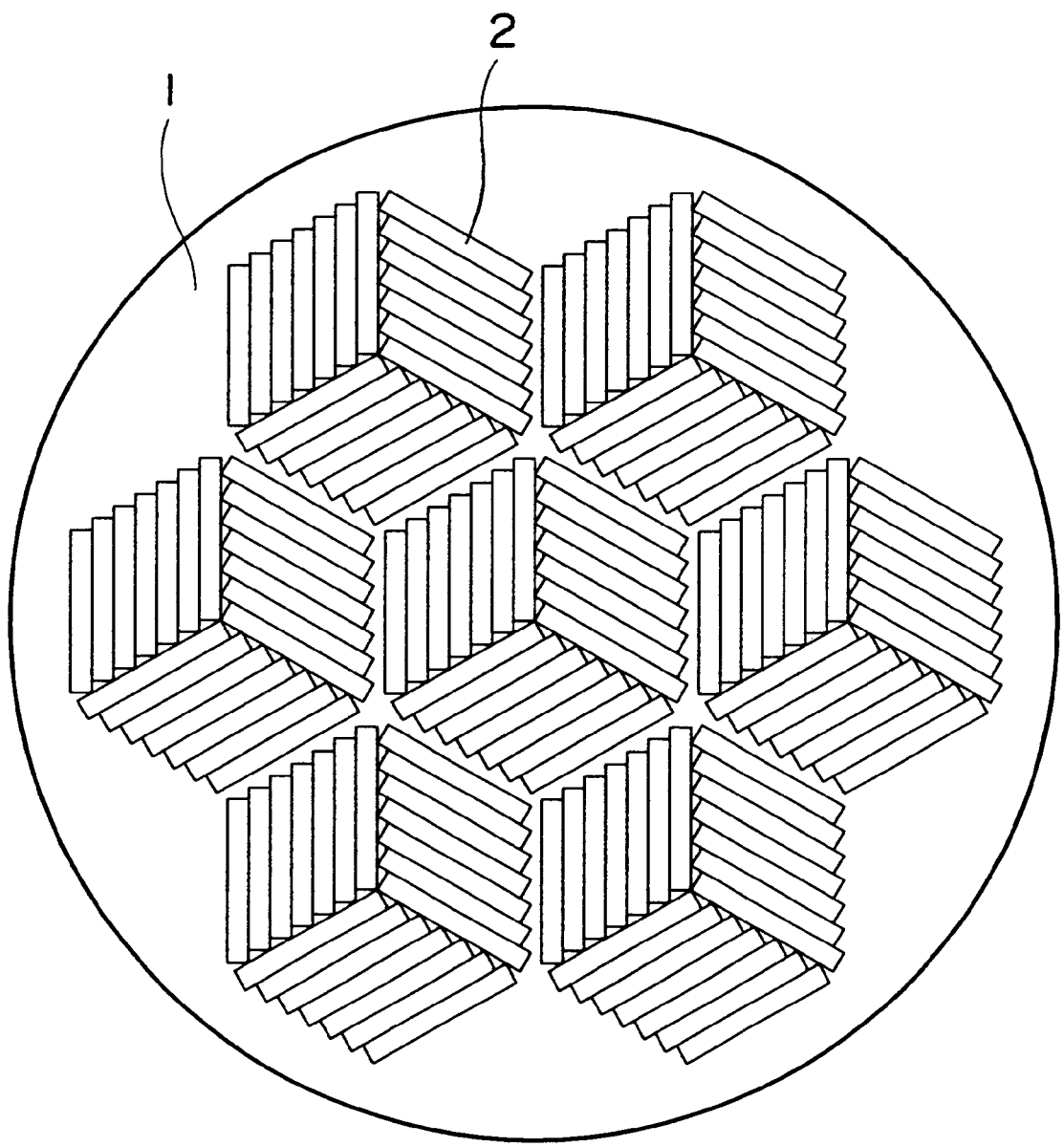

ROTATIONALLY SYMMETRIC OXIDE SUPERCONDUCTING WIRE AND SOLENOID COIL OR MAGNETIC FIELD GENERATOR INCORPORATING THE SAME

TECHNICAL FIELD

The present invention relates to an apparatus for generating a strong magnetic field by utilizing an oxide superconductor. More particularly, the present invention relates to a new oxide superconducting wire which is suitable for those apparatuses which need a strong, uniform magnetic field, such as scientific instruments, NMR analyzers, and medical MRI apparatus. It relates also to a solenoid coil and a magnetic field generating apparatus with said oxide superconducting wire and a process for producing said oxide superconducting wire.

BACKGROUND OF THE INVENTION

Superconducting magnetic apparatuses generally find use in two fields: one in which no consideration need be given to the uniformity and stability of the magnetic field so long as a magnetic field is generated, and the other in which the quality of the magnetic field (or the uniformity and stability of the magnetic field) is a matter of important concern. A highly uniform, highly stable magnetic field is usually required for research work, such as measurements of physical properties and magnetic field generating apparatuses for medical use. It is essential for the technology of high-quality superconducting magnets. Such superconducting magnets have conventionally been produced with accurately worked wires made of a metal superconductor, such as a niobium-titanium superconductor and a niobium-tin superconductor. Superconducting wires are wound into a solenoid under stringent quality control. The resulting superconducting magnet is run with an extremely stable power supply or in a permanent current mode. The thus generated magnetic field is highly stable time-wise and space-wise. Recent years have seen a remarkable advance in magnets generating a highly uniform magnetic field. Magnets capable of generating as high an intensity as 20T have appeared to meet the need for a NMR apparatus. Unfortunately, the intensity of the magnetic field that can be generated by the conventional metal superconductor is limited to about 20T on account of the critical magnetic field inherent in the material used. In order to exceed this limit, it is essential to resort to an oxide superconductor.

A magnetic field generating apparatus has been developed with an oxide superconductor in which the coil is formed by winding a tape-like wire into a double pancake shape, as reported in Journal of Applied Physics, Vol. 35, 1996, Part 2, L623 to 626. This coil is suitable for generating a magnetic field stronger than 22T, which has never been attained with conventional metal superconductors. However, this coil suffers the disadvantage of being unable to generate a uniform magnetic field. The reason for this it that the conductor is in the form of a tape, and the tape is wound into a coil of pancake shape in such a way that more than one coil is placed on top of the other. One way to address this problem is to use a conductor with a round cross section and wind it into a solenoid coil for the magnet, as reported in Journal of Material Science, Vo. 30, 1995, pp. 3200 to 3206. Such a conductor generates a comparatively strong, uniform magnetic field; however, it cannot generate a desired magnetic field because its critical current density (Jc) is only one-fifth that of the tape-like wire. It is possible to secure a strong magnetic field easily by winding a tape-like wire into a solenoid, but it is difficult to secure a sufficiently uniform magnetic field in this way on account of the outer dimensional accuracy of tape-like wire.

A wire with a round cross section is usually produced by drawing a metal through a die, and it has a higher accuracy (of the order of microns) compared with a tape-like wire. Therefore, such a wire is suitable for the generation of uniform magnetic fields. By contrast, a tape-like wire is produced by rolling, and its working accuracy (thickness and width) is usually limited to the order of 10 microns. Therefore, when it is wound in thousands of turns, the number of turns varies from one place to another because of the uneven working accuracy. This results in an uneven magnetic field. For this reason, there has been a demand for an oxide superconducting wire which meets requirements for both high current density and mechanical working accuracy so that it generates a strong, uniform magnetic field.

SUMMARY OF THE INVENTION

It is an object of the present invention to provide an oxide superconducting wire which has high dimensional accuracy and generates a strong, uniform magnetic field. It is another object of the present invention to provide a solenoid coil formed from the oxide superconducting wire. The term "uniform magnetic field" means that the intensity of the magnetic field varies less than 0.1%, preferably less than 0.01%, and the term "strong magnetic field" means that the intensity of the magnetic field is higher than 22T. In the past, it was difficult to generate such a strong, uniform magnetic field; it was only possible to achieve it by means of a magnet formed from an oxide superconducting wire.

The basic reason for this is that an oxide superconductor is a greatly anisotropic substance. When it is made into a tape-like wire by rolling, the resulting wire permits a coil current density of about 50 to 100 A/mm$^2$ in a magnetic field stronger than 10T. However, when it is made into a round wire by drawing, the resulting wire permits a current density of only 10 to 20 A/mm$^2$.

An object of the present invention is to provide an oxide superconducting wire which has high dimensional accuracy and generates a strong, uniform magnetic field with a high critical current density. Another object of the present invention is to provide a solenoid coil and a magnetic field generating apparatus formed from the oxide superconducting wire.

According to the present invention, it is possible to produce an oxide superconducting wire which has high dimensional accuracy without a decrease in current density. The first aspect of the present invention is directed to an oxide superconducting wire which is characterized in that the wire has an approximately round cross section perpendicular to its lengthwise direction, the cross section is composed of several units, each unit being composed of a plurality of tape-like oxide superconductors, the tapes in each unit being laminated stepwise on top of the other in the direction perpendicular to the lengthwise direction at an angle of about 60 degrees with respect to the tape surface within the cross section, each unit having an approximately rhombic shape within the cross section, the cross section having at least three different units which are arranged such that adjacent units have a rotational symmetry through about 120 degrees with respect to the direction of tape lamination and at least one side of the rhombic shape of a unit is in contact with an adjacent unit.

In other words, the oxide superconducting wire of the present invention is characterized in that it has a round cross section perpendicular to its lengthwise direction and the cross section is composed of oxide cores which are geometrically arranged at rotationally symmetric positions. This rotational symmetry may be established by 3 rotations, 4 rotations, or 6 rotations within the round cross section. For the oxide to be packed most closely, it is desirable to arrange the cores in triangular symmetry. It follows, therefore, that the most efficient packing ratio (or the ratio of the sectional area of the oxide to the total sectional area) is achieved when three rhombi are arranged in rotational symmetry, each rhombus being composed of two regular triangles.

According to the present invention, the oxide superconductor has a tape-like shape, and these tapes are laminated on top of the other to form a conductor. However, it is very difficult to obtain a conductor of ideal configuration because of the limitation accuracy in tape rolling and tape assembling. In view of this, the angle of lamination direction should be about 60 degrees or 120 degrees. The closer to ideal the shape is, the better the performance will be. As the shape departs from the ideal, the performance of the oxide decreases. The allowance of the angle is about 5 degrees. If the allowance exceeds this limit, the performance will decrease to ½ to ⅓.

The second aspect of the present invention is directed to an oxide superconducting wire with a round cross section which, in its cross section perpendicular to its Lengthwise direction, is composed of three units, each unit consisting of laminated tape-like oxide superconductors, the assembly of the units being concentrated to form a closest-packed shape at the center of the cross section, with all the tapes having at least one end thereof in contact with the sheathing material constituting the periphery of the wire.

The above-mentioned rotational symmetry will be satisfactory so long as it is formed within three adjacent units; thus, it is not necessary that all the units form the rotational symmetry in the cross section. Symmetry is essential to prevent the shape from being disturbed during drawing for isotropic reduction in cross section symmetry with three units is not a must; but it is easiest to form. The contact with the sheathing material is not a direct concern of the present invention; it is mentioned here merely from a geometrical point of view.

According to the present invention, the tape-like oxide superconductors may be formed from multi-core wires.

According to the present invention, the tape-like oxide superconductors may be multi-core wires which are twisted.

According to the present invention, the tape-like oxide superconductors may be multi-core wires which are twisted and the tapes are arranged with a high-resistance layer interposed between them.

According to the present invention, the tape-like oxide superconductors may be multi-core wires which are twisted and the tapes are arranged with a high-resistance layer interposed between them, and the superconducting wire is twisted.

According to the present invention, the oxide superconducting wire mentioned above is characterized in that the oxide superconductor should preferably be $Bi_2Sr_2Ca_1Cu_2O_x$. This oxide superconductor may be replaced by others such as $(Bi,Pb)_2Sr_2Ca_2Cu_3O_x$ and a thallium-based superconductor.

Examples of the oxide superconductors that can be used in the present invention include:

Bi—Sr—Ca—Cu—O type:

$Bi_{1.5-2.2}$—$Sr_{5-2.2}$—$Cu_{0.5-1.3}$—$O_{5-7}$, $Bi_{1.5-2.2}$—$Sr_{1.5-2.2}$—$Ca_{0.5-1.3}$—$Cu_{1.5-2.3}$—$O_{7-9}$, $Bi_{1.5-2.2}$—$Sr_{1.5-2.3}$—$Ca_{1.5-2.3}$—$Cu_{2.5-3.3}O_{9-11}$,

Bi—Pb—Sr—Ca—Cu—O type:

$(Bi_y$—$Pb_{1-y})_{1.5-2.2}$—$Sr_{1.5-2.2}$—$Cu_{0.5-1.3}$—$O_{5-7}$, $(Bi_y$—$Pb_{1-y})_{1.5-1.2}$—$Sr_{1.5-2.2}$—$Ca_{0.5-1.3}$—$Cu_{1.5-2.3}$—$O_{7-9}$, $(Bi_y$—$Pb_{1-y})_{1.5-2.2}$—$Sr_{1.5-2.3}$—$Ca_{1.5-2.3}$—$Cu_{2.5-3.3}$—$O_{9-11}$, where y=0–1 to 0.9.

The third aspect of the present invention is directed to an oxide superconducting wire characterized in that the cross section of the wire is round and is composed of several units, each consisting of tape-like superconductors laminated in an approximately rhombic shape, which are arranged such that they form a hexagon as a whole. In other words, the oxide superconducting wire has a round cross section perpendicular to its lengthwise direction within the plane of the cross section, the oxide superconductor is composed of several units, each consisting of a plurality of tape-like superconductors laminated one over another. The laminated tapes form an approximately rhombic shape. Within the plane of the cross section, there are at least three units, which are rotationally symmetric with adjacent units in the direction of tape lamination. At least one side of the rhombus is opposite to the adjacent unit.

The fourth aspect of the present invention is directed to an oxide superconducting wire composed of a metal sheath and a core as an assembly of oxide superconducting filaments, characterized in that the core is made up of multi-core tape wires, each consisting of oxide superconducting filaments, which are arranged in rotational symmetry, the oxide superconducting filaments having a cross section such that the average thickness is 3 to 20 $\mu$m and the average aspect ratio is larger than 2 and smaller than 10. The oxide superconducting tape-like wires are arranged in rotational symmetry. This step is accomplished when the multi-core tape-like wires are packed in the third metal pipe which becomes the metal sheath later.

The fact that the multi-core tape-like wires are arranged in rotational symmetry offers the advantage that the oxide superconductor in the oxide superconducting filaments permits its c axis to orient in various directions. This makes it possible to prevent the critical current from decreasing irrespective of the direction in which the magnetic field is applied and to increase the critical current density (Jc) because the oxide superconducting filament has an optimal size. The oxide superconductor should be a bismuth-based oxide superconductor, and preferably be one which has a composition of $Bi_2Sr_2Ca_1Cu_2O_x$.

The metal sheath may be formed from silver or a silver alloy, such that the ratio of the metal sheath to the oxide superconducting filaments is greater than 3 and smaller than 7. This makes it possible to increase further the critical current density (Jc).

In the case where the oxide superconducting wire has a rectangular shape, its cross section should have an aspect ratio greater than 1 and smaller than 6.

The oxide superconducting wire should be formed from an oxide superconductor (or a raw material thereof) in the form of powder having an average particle diameter smaller than 3 $\mu$m, so that it is comparable to the conventional tape-like oxide superconducting wire in current flow characteristics and can be formed continuously.

According to the present invention, the oxide superconducting wire has better working accuracy compared with the conventional tape-like oxide superconducting wire. When the oxide superconducting wire is made into a solenoid, the resulting solenoid has a smaller deviation (in the axial and circumferential direction) than the pancake coil formed from the conventional tape-like oxide superconducting wire. Therefore, such a solenoid coil can produce a strong, uniform magnetic field.

BRIEF DESCRIPTION OF DRAWINGS

FIG. 2 is a diagram showing the cross section of the oxide superconducting wire representing a second example of the present invention;

BEST MODE FOR CARRYING OUT THE INVENTION

The invention will be described in more detail with reference to the following examples, which are not intended to restrict the scope thereof.

EXAMPLE 1

Figure 1:
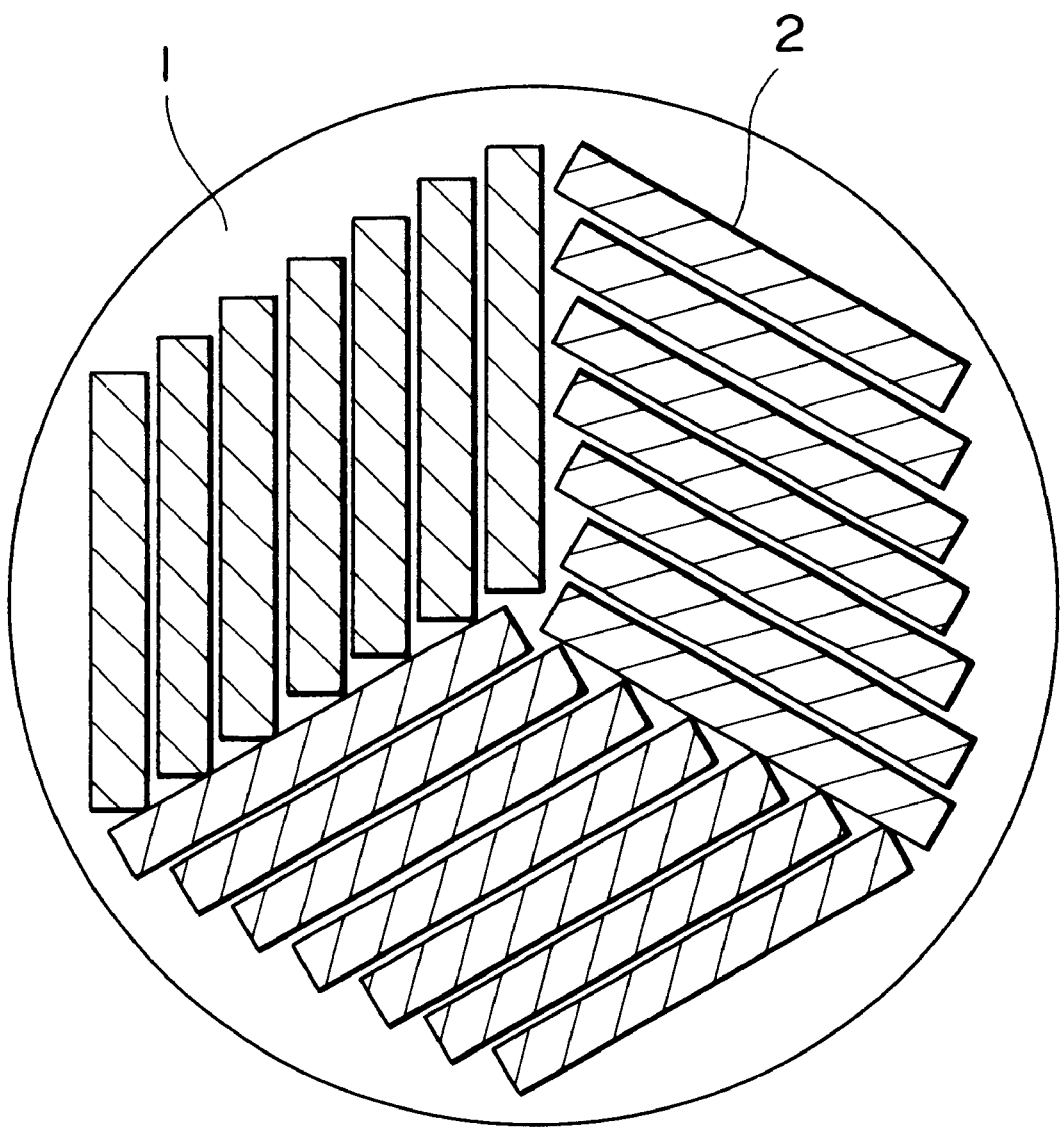
FIG. 1 is a diagram showing the cross section of an oxide superconducting wire representing a first example of the present invention.

The first example of the invention is shown in FIG. 1. According to the present invention, the oxide superconducting wire is produced by drawing. It has a uniform, round cross section. It is composed of a silver sheath 1 and a superconductor 2 of $Bi_2Sr_2Ca_1Cu_2O_x$ in the form of tape-like filaments. The tape-like filaments are laminated on top of another to constitute one unit and three units are united into one. Lamination in each unit is accomplished stepwise so that the laminated seven layers form a rhombus in the cross section perpendicular to the lengthwise direction. The laminate having a rhombic cross section constitutes one unit. Three units are combined into one, so that the core is formed from 21 layers. All the layers as a whole constitute in cross section a regular hexagon. The three units are arranged in a rotational symmetry through 120 degrees. In FIG. 1, the hatched parts denote the tape-like filaments of a superconductor, and the white parts other than the black tape denote the silver sheath.

In this example, seven tapes (layers) are laminated; however, the number of layers is not specifically restricted, but should be determined according to the workability of the material, the volume ratio of the superconductor, and the application of the wire. The wire should preferably have a diameter of 1 to 2 mm; however, the diameter may vary depending on the application of the wire. If the wire is to be used for AC, it may be twisted at a pitch of 10 to 100 mm. The reason why the wire should preferably have an outside diameter of 1 to 2 mm is that this diameter is common for wires used for superconducting coils and this diameter permits a critical current of about 1000 A. With an excessively large diameter, the wire presents difficulties in coil winding and has an excessively large current value. The reason why the twisting pitch should preferably be 10 to 100 mm for AC use is that it is necessary to keep AC loss below 0.1 W/m for a commercial frequency of 50 to 60 Hz.

EXAMPLE 2

The second example of the invention is shown in FIG. 2. According to the present invention, the oxide superconducting wire is produced by drawing. It has a uniform, round cross section. It is composed of a silver sheath 1 and a superconductor 2 of $Bi_2Sr_2Ca_1Cu_2O_x$ in the form of tape-like filaments. The tape-like filaments are laminated on top of another to constitute one unit and three units are united into one. Lamination in each unit is accomplished stepwise, as in Example 1, so that the laminated seven layers form a rhombus in the cross section perpendicular to the lengthwise direction. The laminate having a rhombic cross section constitutes one unit. Three units are combined into one, so that the core is formed from 21 layers. All the layers as a whole constitute in cross section a regular hexagon. The three units are arranged in a rotational symmetry through 120 degrees. Three units constitute one segment with a hexagonal shape. Seven segments in total are united closely. The wire should preferably have a diameter of 1 to 2 mm; however, the diameter may vary depending on the application of the wire. If the wire is to be used for AC, it may be twisted at a pitch of 10 to 100 mm. The term "united closely" means that the united segments constitute a honeycomb structure.

EXAMPLE 3

Figure 3:
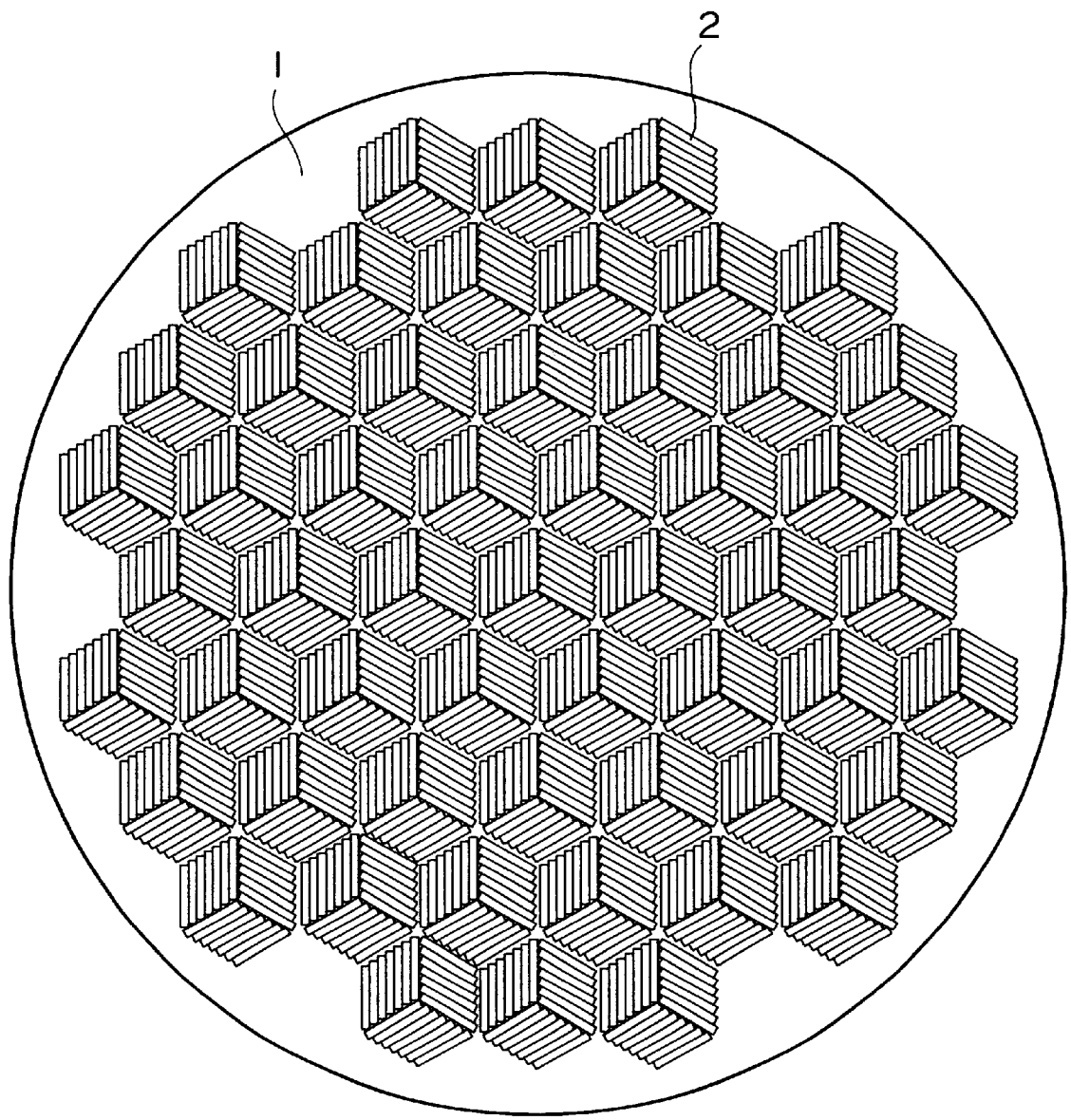
FIG. 3 is a diagram showing the cross section of the oxide superconducting wire representing a third example of the present invention.

The third example of the invention is shown in FIG. 3. According to the present invention the oxide superconducting wire is produced by drawing. It has a uniform, round cross section. It is composed of a silver sheath 1 and a superconductor 2 of $Bi_2Sr_2Ca_1Cu_2O_x$ in the form of tape-like filaments. The tape-like filaments are laminated on top of another to constitute one unit and three units are united into one. Lamination in each unit is accomplished stepwise, as in Example 1, so that the laminated seven layers form a rhombus in the cross section perpendicular to the lengthwise direction. The laminate having a rhombic cross section constitutes one unit. Three units are combined into one, so that the core is formed from 21 layers. All the layers as a whole constitute in cross section a regular hexagon. The three units are arranged in a rotational symmetry through 120 degrees. Three units constitute one segment with a hexagonal shape. Fifty-five segments in total are united closely. The wire should preferably have a diameter of 1 to 2 mm; however, the diameter may vary depending on the application of the wire. If the wire is to be used for AC, it may be twisted at a pitch of 10 to 100 mm.

EXAMPLE 4

Figure 4:
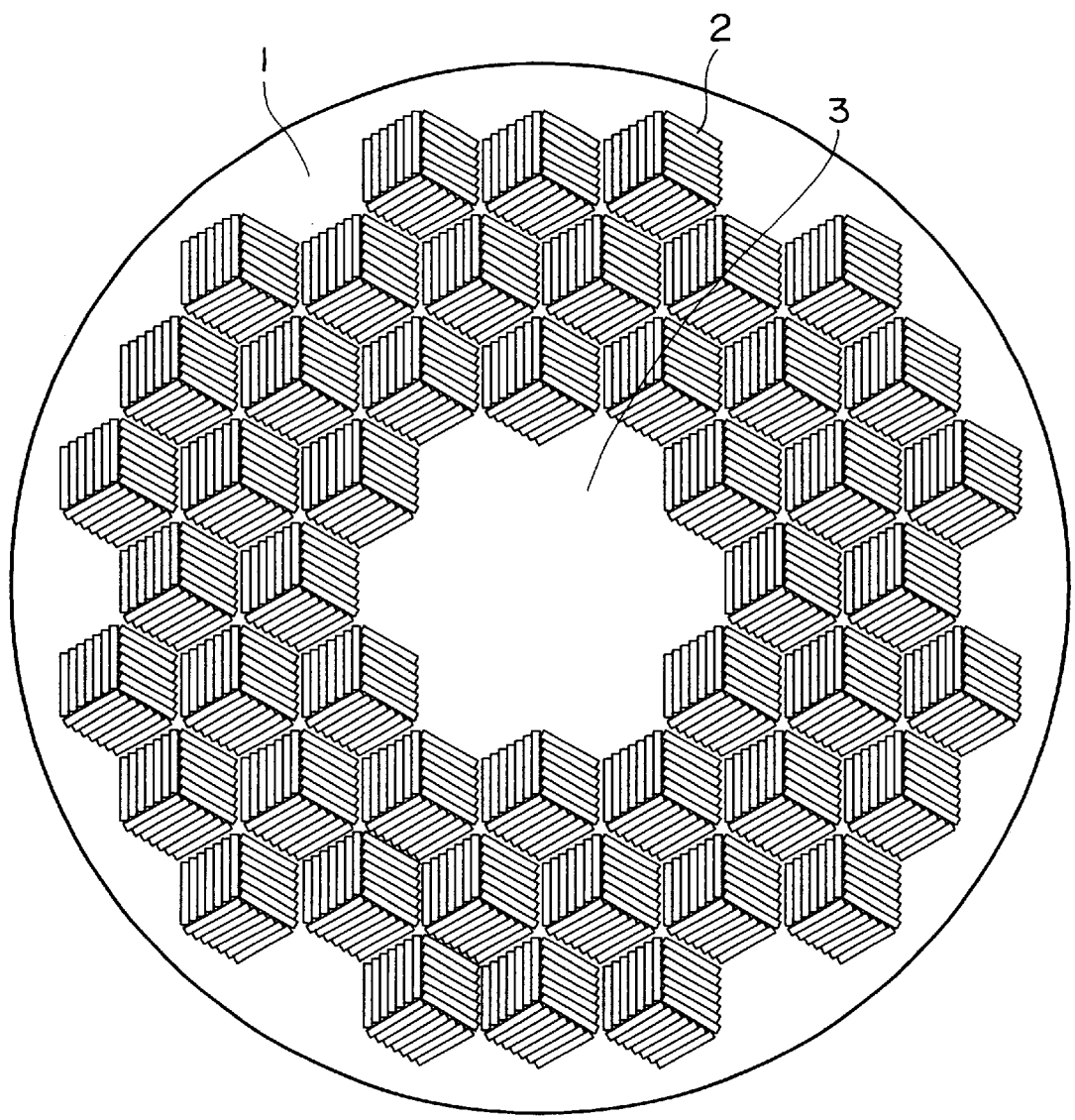
FIG. 4 is a diagram showing the cross section of the oxide superconducting wire representing a fourth example of the present invention.

The fourth example of the invention is shown in FIG. 4. According to the present invention, the oxide superconducting wire is produced by drawing. It has a uniform, round cross section. It is composed of a silver sheath 1 and a superconductor 2 of $Bi_2Sr_2Ca_1Cu_2O_x$ in the form of tape-like filaments. The tape-like filaments are laminated on top of another to constitute one unit and three units are united into one. Lamination in each unit is accomplished stepwise, as in Example 1, so that the laminated seven layers form a rhombus in the cross section perpendicular to the lengthwise direction. The laminate having a rhombic cross section constitutes one unit. Three units are combined into one, so that the core is formed from 21 layers. All the layers as a whole constitute in cross section a regular hexagon. The three units are arranged in a rotational symmetry through 120 degrees. Three units constitute one segment with a hexagonal shape. Forty-eight segments in total are united closely. At the center of the cross section is a metal layer 3 to enhance the thermal stability and the mechanical strength of the wire. This metal layer may be formed from a silver alloy containing 0.5 wt % of magnesium, which is superior to silver in mechanical strength and is comparable to silver in thermal conductivity. The wire should preferably have a diameter of 1 to 2 mm; however, the diameter may vary depending on the application of the wire. If the wire is to be used for AC, it may be twisted at a pitch of 10 to 100 mm.

EXAMPLE 5

Figure 5:
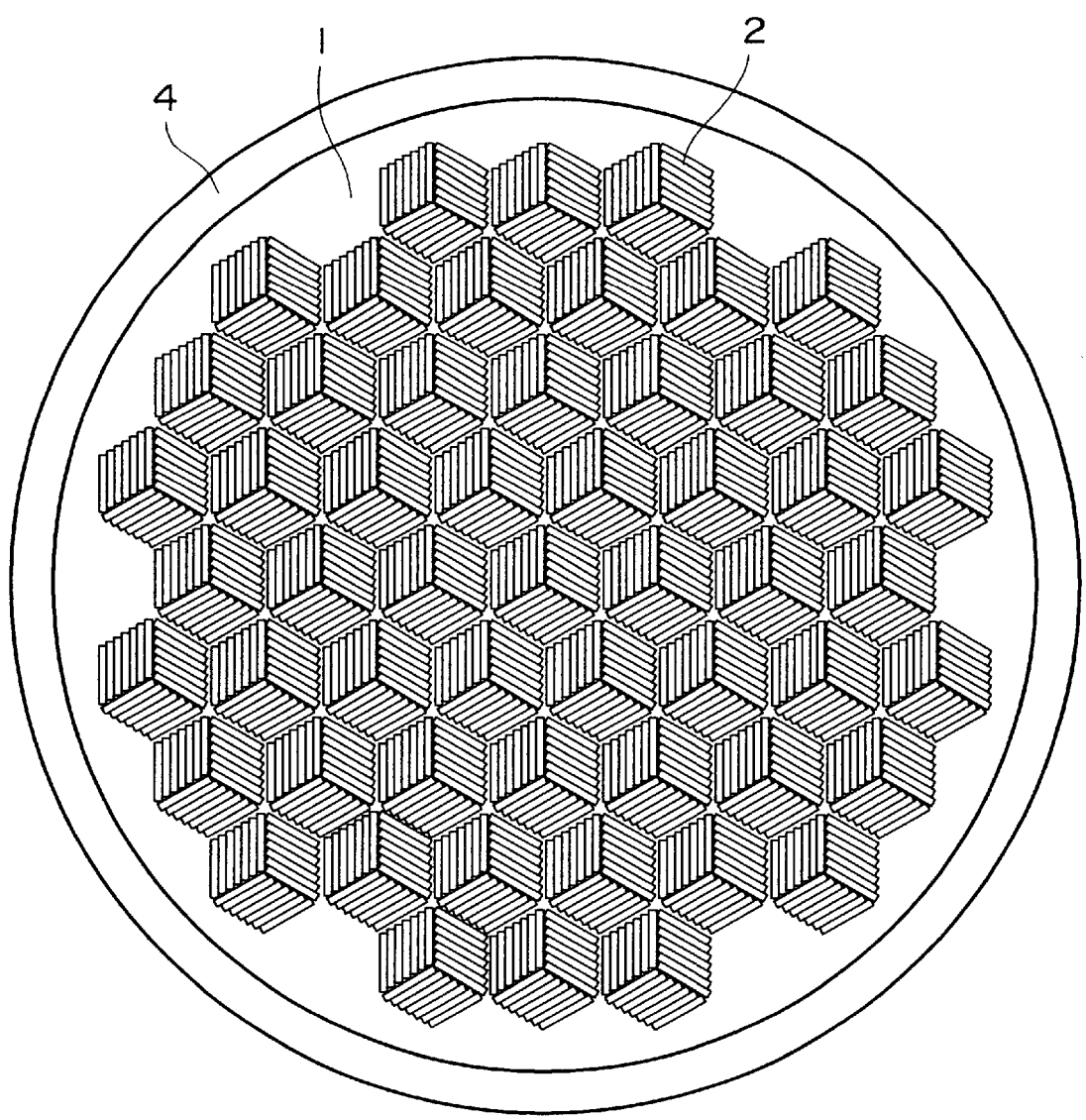
FIG. 5 is a diagram showing the cross section of the oxide superconducting wire representing a fifth example of the present invention.

The fifth example of the invention is shown in FIG. 5. According to the present invention, the oxide superconducting wire is produced by drawing. It has a uniform, round cross section. It is composed of a silver sheath 1 and a superconductor 2 of $Bi_2Sr_2Ca_1Cu_2O_x$ in the form of tape-like filaments. The tape-like filaments are laminated on top of an other to constitute one unit and three units are united into one. Lamination in each unit is accomplished stepwise, as in Example 1, so that the laminated seven layers form a rhombus in the cross section perpendicular to the lengthwise direction. The laminate having a rhombic cross section constitutes one unit. Three units are combined into one, so that the core is formed from 21 layers. All the layers as a whole constitute in cross section a regular hexagon. The three units are arranged in a rotational symmetry through 120 degrees. Three units constitute one segment with a hexagonal shape. Fifty-five segments in total are united closely. The periphery 4 of the wire is made of reinforced silver alloy containing 0.5 wt % of magnesium, so that the wire has an allowable stress increased to 200 MPa. The wire should preferably have a diameter of 1 to 2 mm; however, the diameter may vary depending on the application of the wire. If the wire is to be used for AC, it may be twisted at a pitch of 10 to 100 mm.

EXAMPLE 6

Figure 6:
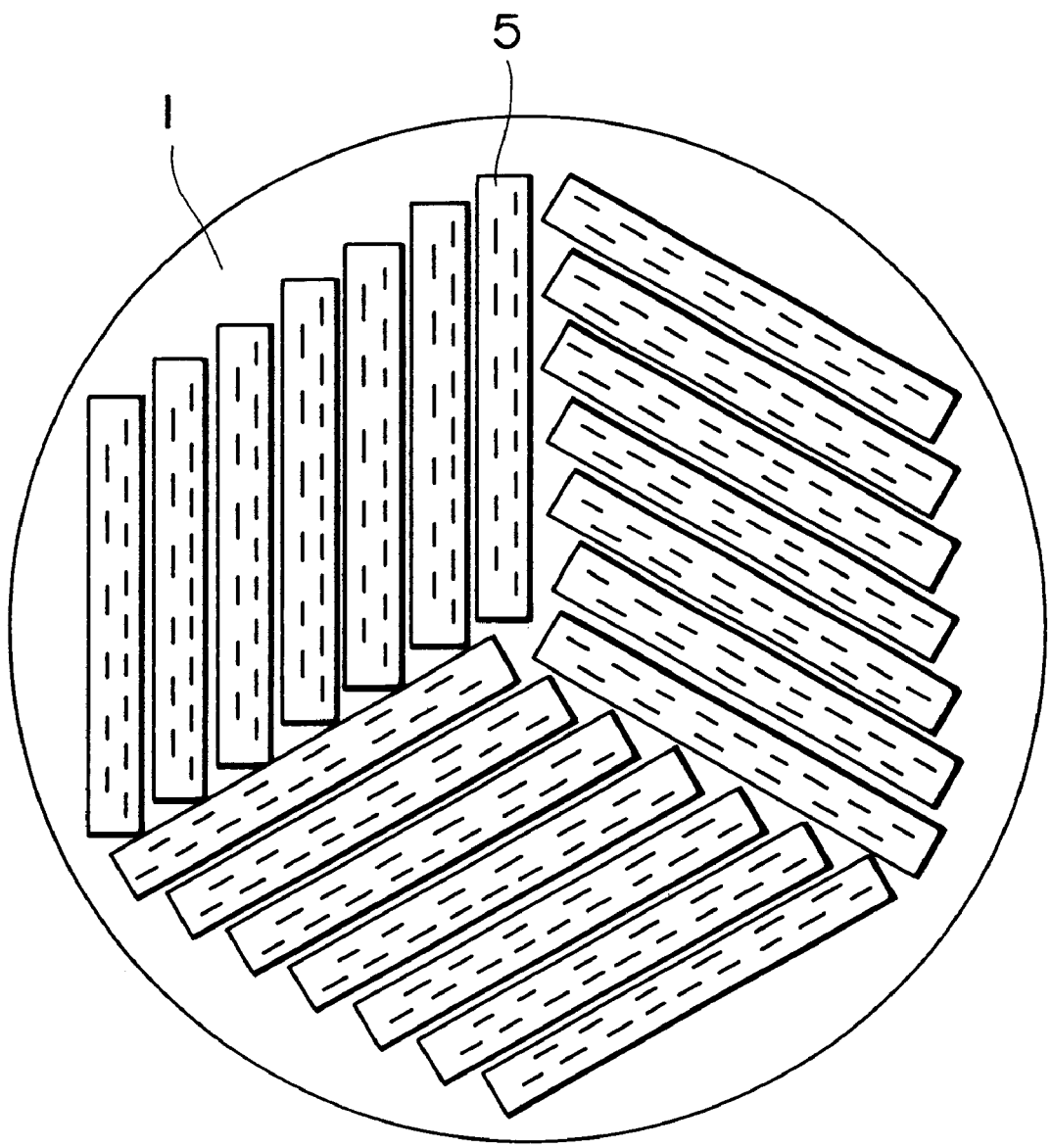
FIG. 6 is a diagram showing the cross section of the oxide superconducting wire representing a sixth example of the present invention.

The sixth example of the invention is shown in FIG. 6. According to the present invention, the oxide superconducting wire is produced by drawing. It has a uniform, round cross section. It is composed of a silver sheath 1 and a superconductor 2 of $Bi_2Sr_2Ca_1Cu_2O_x$ in the form of tape-like multi-core wires 5. The tape-like multi-core wires are laminated on top of another to constitute one unit and three units are united into one. Lamination in each unit is accomplished stepwise so that the laminated seven layers form a rhombus in the cross section perpendicular to the lengthwise direction. The laminate having a rhombic cross section constitutes one unit. Three units are combined into one, so that the core is formed from 21 layers. All the layers as a whole constitute in cross section a regular hexagon. The three units are arranged in a rotational symmetry through 120 degrees.

In this example, seven tape wires (layers) are laminated; however, the number of layers is not specifically restricted, but should be determined according to the workability of the material, the volume ratio of the superconductor, and the application of the wire. The wire should preferably have a diameter of 1 to 2 mm; however, the diameter may vary depending on the application of the wire. If the wire is to be used for AC, it may be twisted at a pitch of 10 to 100 mm.

Figure 7:
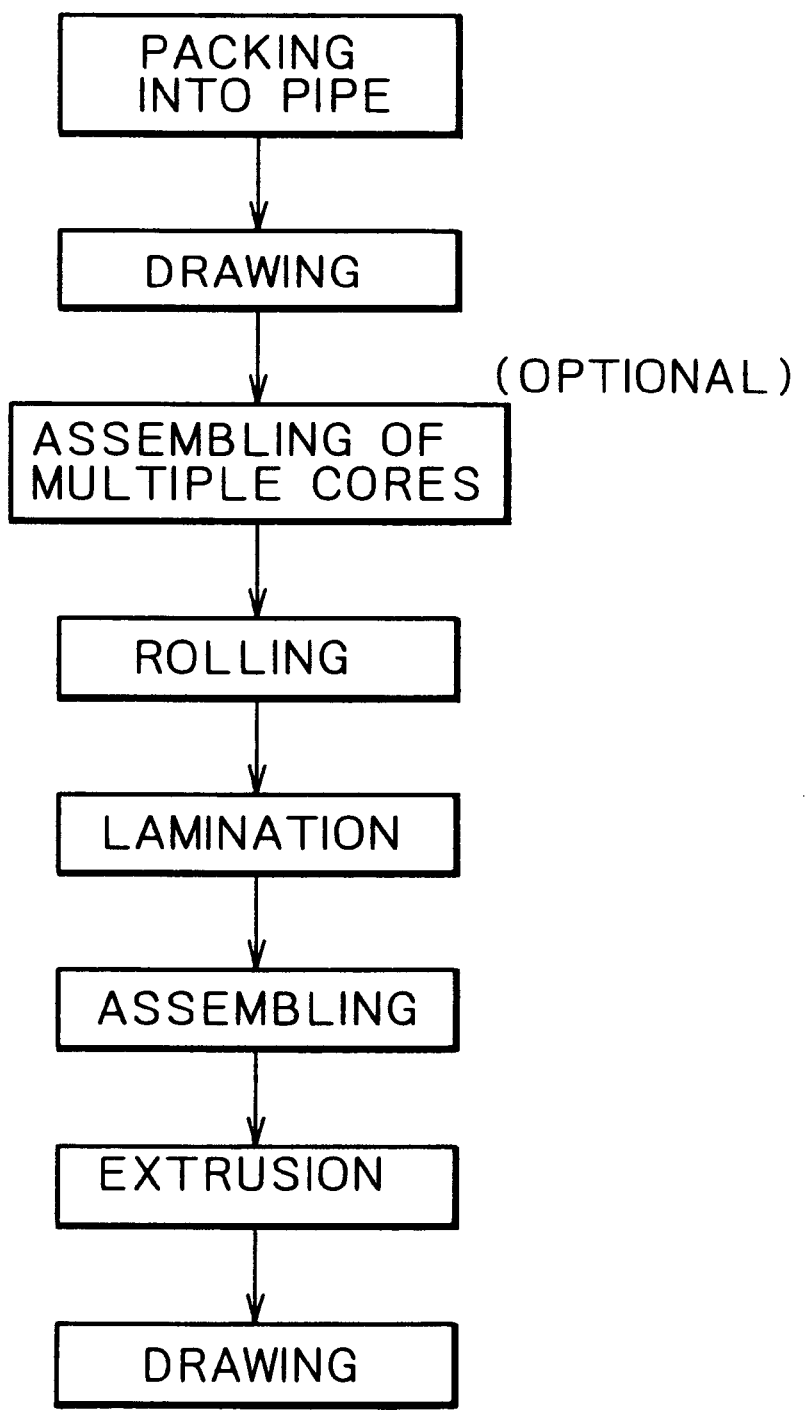
FIG. 7 is a flow diagram showing the process of producing the oxide superconducting wire in the sixth example.

FIG. 7 demonstrates the process for producing the oxide superconducting wire according to the present invention. A previously prepared powder of oxide superconductor is packed into a sheath (or pipe) of silver or silver alloy. The packed sheath is drawn to produce a single core wire. If necessary, drawing may be performed again on more than one single core wire bundled together. The resulting wire is formed into a tape, 0.1 to 0.3 mm thick and 2 to 5 mm wide, by rolling. Seven tapes were laminated in the direction of thickness. The laminated tapes were placed in another silver pipe such that their geometrical arrangement is shown in FIG. 1. The silver pipe underwent hydrostatic extrusion, which was followed by drawing. Thus, there was obtained a long wire, 0.5 to 2 mm in outside diameter and 100 to 1000 m in length.

For dimensional accuracy, the final drawing was carried out by using a specially calibrated diamond die. In this way it was possible to obtain a wire which has a specific outer shape (for example, the shape for a solenoid) necessary for the generation of uniform magnetic field.

In this example, the rolled tape is 0.1 to 0.3 mm thick and 2 to 5 mm wide. This tape is easy to handle and unite into a rhombic shape. The tape should preferably have an aspect ratio greater than 10. With an aspect ratio smaller than 10, the critical current density of the wire will be decreased by more than half.

The wire shown in Example 2 was made into a solenoid coil, 60 mm in inside diameter, 130 mm in outside diameter, and 600 mm in height, with the insulating material being an alumina sleeve. The solenoid coil underwent heat treatment (for partial melting) at 870 to 885° C. for 10 to 30 minutes. This heat treatment was followed by carrier concentration adjustment in a mixture gas of 5% oxygen and 95% argon at 800° C. Finally, the solenoid coil was impregnated with epoxy resin for reinforcement.

In a first comparative example, a double-pancake coil, 60 mm in inside diameter, 130 mm in outside diameter, and 15 mm in height, was formed by winding a tape-like wire. Forty double-pancake coils were placed on top of the other. In a second comparative example, a single-core wire (with a silver sheath and a round cross section) was prepared by drawing from an oxide superconductor (Bi-2212 type). This wire was made into a solenoid coil, 60 mm in inside diameter, 130 mm in outside diameter, and 600 mm in height, with the insulating material being alumina sleeve. In the first comparative example, one magnet is formed from 40 coils placed on top of one another. It generates a strong magnetic field, but the magnetic field lacks uniformity.

In a second comparative example, a single-core wire (with a silver sheath and a round cross section) was prepared by drawing from an oxide superconductor (Bi-2212 type). This wire was made into a solenoid coil, 60 mm in inside diameter, 130 mm in outside diameter, and 600 mm in height, with the insulating material being an alumina sleeve. This coil was tested for its performance at 4.2 K in a backup magnetic field of 21T. The results of the test are shown in Table 1.

TABLE 1

|  | Coil current density (A/mm$^2$) | Uniformity of magnetic field (%) | Intensity of magnetic field generated (T) in 21T | Operating current (A) |
| --- | --- | --- | --- | --- |
| Working Example | 100 | 0.01 | 3.3 | 250 |
| Comparative Example | 125 | 0.3 | 3.8 | 280 |
| Comparative Example 2 | 25 | 0.01 | 0.8 | 30 |

The coil current density is the current density per unit area of the cross section of the coil. The uniformity of magnetic field is the fluctuation of the magnetic field which occurs within 30 mm (in diameter) at the center of the coil. The magnetic field generated is the value measured at the center of the coil. The operating current is defined as the maximum value of flowing current. The sample in Comparative Example 1 is superior to the sample in the Working Example in the intensity of magnetic field generated. However, it cannot generate a uniform magnetic field because the number of windings varies from one double-pancake to another. The reason for this is that the tape wire varies in thickness due to poor working accuracy. The tape thickness is in the range of 0.1 to 0.3 mm, whereas the thickness variation is about 10%. By contrast, the wire with a round cross section in Comparative Example 2 is superior in dimensional accuracy and gives a coil which generates a uniform magnetic field. However, the magnetic field is weak because the oxide superconductor lacks crystal orientation.

The wire in this working example has a round cross section and hence generates a uniform, strong magnetic field. In addition, the oxide superconductor in the wire has a tape-like shape, and the c axis of the crystal orients along the tape surface. Therefore, the wire produces good superconducting characteristics.

This working example demonstrates a magnet according to the W&R method which involves heat-treatment after winding. However, this working example may also be applied to a magnet according to the R&W method in which the wire is wound after heat treatment. In this case, enamel coating or formal coating may be used as the insulating material. The resulting solenoid coil generates a uniform magnetic field. In the case of a magnet according to the R&W method, bending is carried out after heat treatment. Therefore, the wire is damaged by winding and the resulting coil decreases in performance. On the other hand, however, it offers the advantage that the insulating material can be made thin and the coil deformation due to heat treatment can be prevented. Therefore, it is an advantageous method for producing a uniform magnetic field, except for damage to the wire. There has been no high-performance wire with a round cross section. The present invention provides a wire with a round cross section which permits a high critical current density Jc in a strong magnetic field. A round wire is produced with high precision and generates a uniform magnetic field when wound-into a solenoid. According to the present invention, it is possible to generate a uniform magnetic field stronger than 2T in a magnetic field stronger than 21T. Thus, the present invention makes feasible various apparatus (such as scientific instruments, NMR analyzers, and medical MRI apparatus) that employ an oxide superconducting magnet.

EXAMPLE 7

Figure 8:
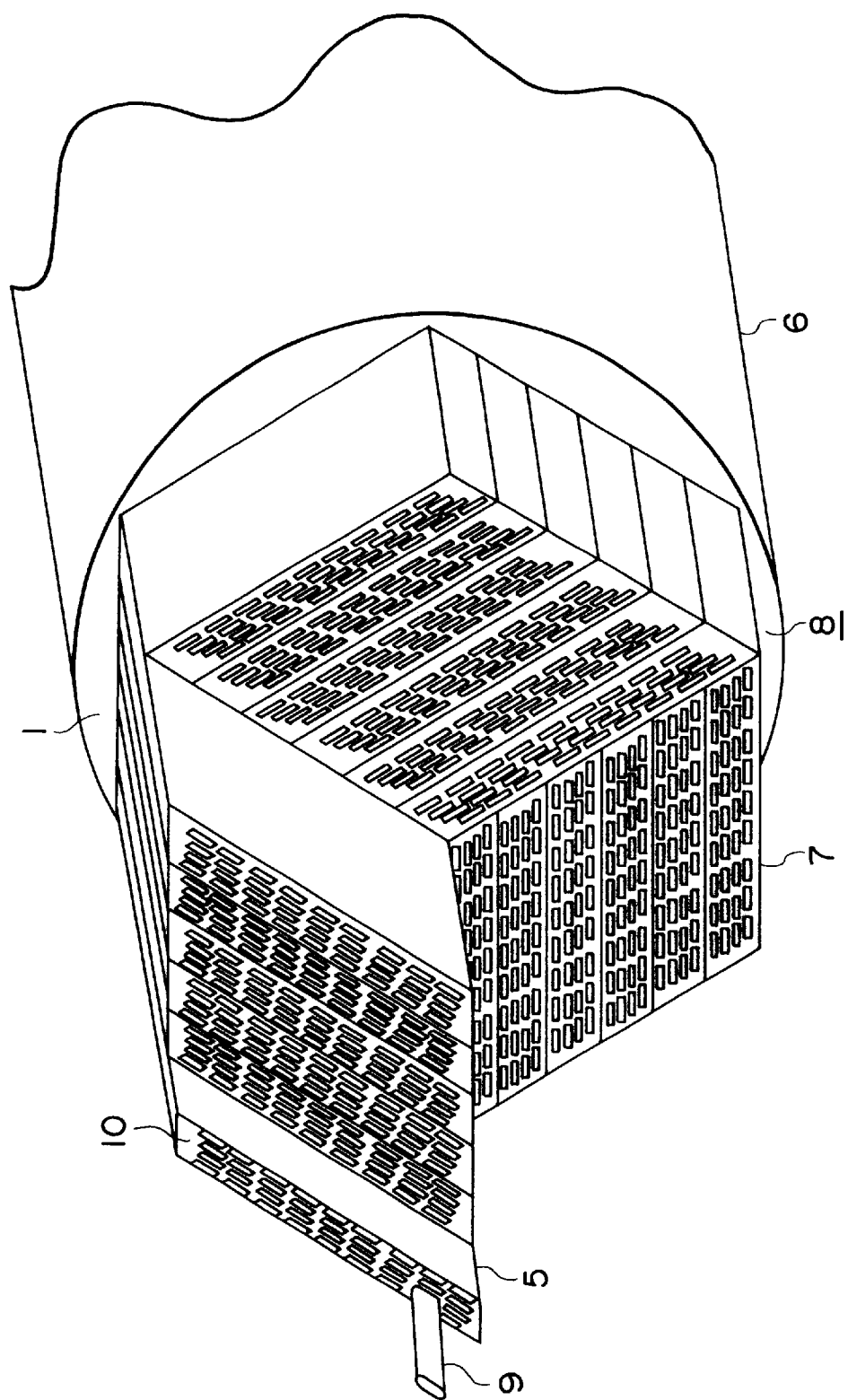
FIG. 8 is a diagram showing the oxide superconducting multi-core wire 6 representing a seventh example of the present invention.
Figure 9:
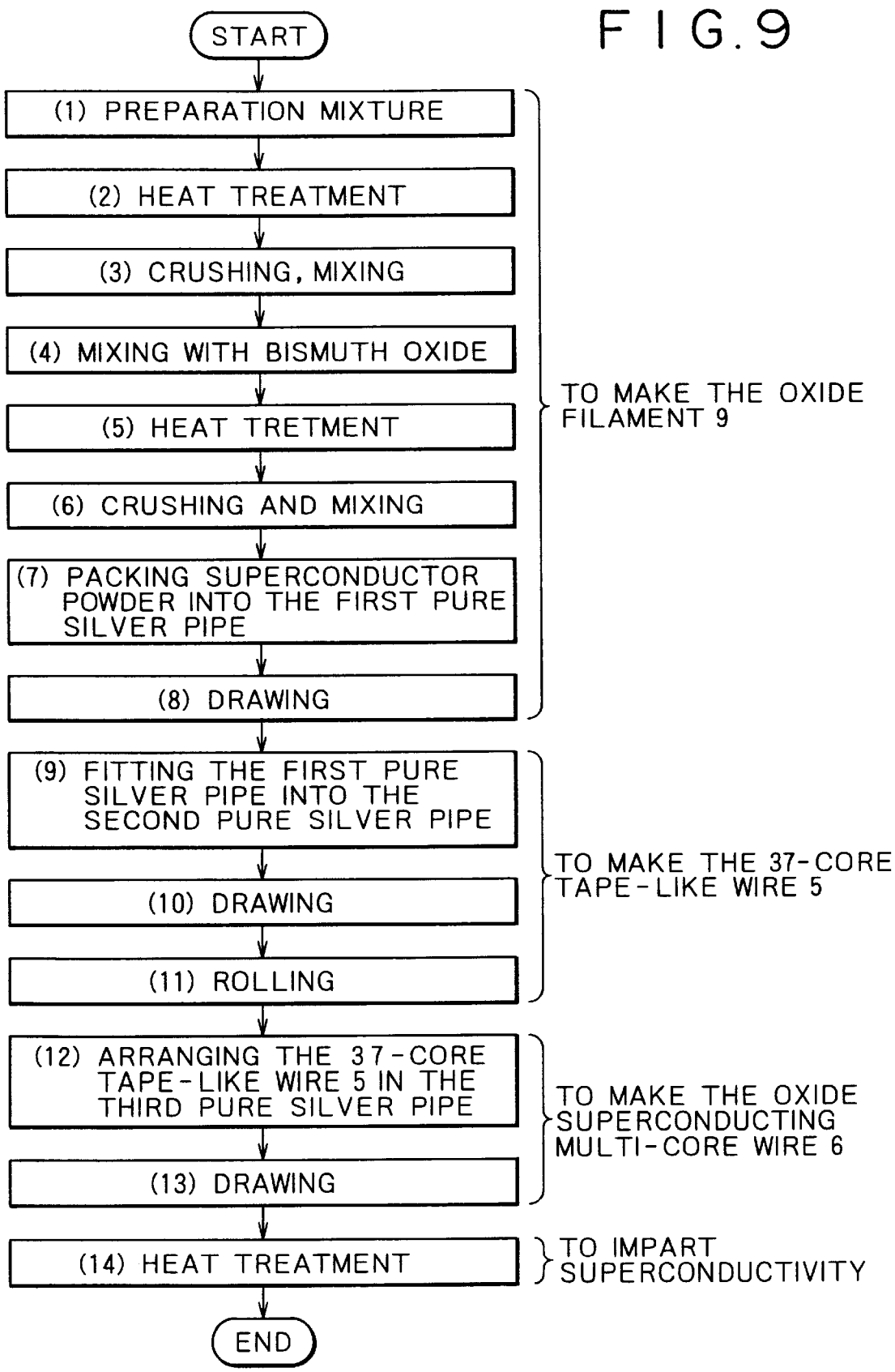
FIG. 9 is a flow diagram showing the process of producing the oxide superconducting multi-core wire 6.

The seventh example of the invention relates to an oxide superconducting multi-core wire 6 as shown in FIG. 8. The oxide superconducting multi-core wire 6 is composed of 37-core tape wires 5, which are arranged in rotational symmetry in the cross section perpendicular to the lengthwise direction. The tape wires are covered with a silver sheath 1. In this example, six 37-core tape wires 5 are laminated and combined into single sets. Six sets are combined into one segment 7. Three segments are arranged in rotational symmetry through 120 degrees, so that a hexagonal core 8 is formed. The 37-core tape wire 5 is formed by covering 37 oxide superconducting filaments 9 with a silver sheath 10. Therefore, one oxide superconducting multi-core wire 6 contains 666 oxide superconducting filaments 9 (37×6×3=666). The number of oxide superconducting filaments 9 may be properly selected according to the shape of the wire.

(Production Method)

The oxide superconducting multi-core wire 6 in this example is produced in the following manner.

The process starts with producing the oxide superconducting filament 9.

(1) The starting materials for the oxides are strontium oxide (SrO) calcium oxide (CaO), and copper oxide (CuO), all having a purity higher than 99%. They are weighed such that the atomic molar ratio of strontium (Sr), calcium (Ca), and copper (Cu) is 2.0:1.0:2.0. The resulting mixture is placed in a centrifugal ball mill and mixed for 20 minutes.

(2) The mixture undergoes heat treatment in the atmosphere at 900° C. for 20 hours.

(3) The heat-treated mixture is cooled to room temperature and then crushed and mixed again in a centrifugal ball mill for 20 minutes.

(4) The resulting powder is given a prescribed amount of bismuth oxide ($Bi_2O_3$) so that the mixture contains bismuth (Bi), strontium (Sr), calcium (Ca), and copper (Cu) in an atomic molar ratio of 2.0:2.0:1.0:2.0. The mixture is mixed in a centrifugal ball mill for 20 minutes.

(5) The thus obtained powder is heated in the atmosphere at 800 to 850° C. for 10 hours. In this way there is obtained a superconducting powder.

This superconducting powder was examined by powder X-ray diffractometry and observed under a scanning electron microscope (SEM). It was found to contain some strontium oxide (SrO) and copper oxide (CuO) and a small amount of unreacted non-superconducting phase which was not identified.

(6) The superconducting powder is crushed and mixed in a centrifugal ball mill so as to give a superconducting fine powder having an average particle diameter smaller than 3 μm.

(7) The thus obtained superconducting fine powder is packed in a first pure silver pipe which has a round cross section, 21.0 mm in outside diameter and 17.5 mm in inside diameter.

(8) This first pure silver (Ag) pipe is drawn by means of a draw bench such that the reduction in area is 11 to 13% until the outside diameter is reduced to 2.5 mm. The resulting product is then made into the oxide superconducting filament 9.

(9) The first pure silver (Ag) pipe, which has been reduced in diameter, is then cut into 37 equal lengths. The 37 cut pieces are packed into a second pure silver (Ag) pipe, 21.0 mm in outside diameter and 18.2 mm in inside diameter. The number of the cut pieces should be properly adjusted according to the intended use.

(10) This second pure silver (Ag) pipe is drawn by means of a draw bench such that the reduction in area is 11 to 13% until the outside diameter is reduced to 1.5 to 2.0 mm.

(11) The second pure silver (Ag) pipe, which has been reduced in diameter, is then rolled into a 37-core tape-like wire 5 which has a flat cross section, 0.10 to 0.50 mm thick and 1.0 to 5.0 mm wide.

Subsequently, the 37-core tape wire 5 is made into the oxide superconducting multi-core wire 6.

(12) The 37-core tape wire 5 is cut into 18 pieces, which are subsequently divided into three groups, each consisting of 6 pieces. Six pieces are laminated on top of each other so as to form the rhombic segment 7. Three sets of the segment 7 are packed into a third pure silver (Ag) pipe, 21.0 mm in outside diameter and 18.2 mm in inside diameter. (They are arranged in rotational symmetry in the pipe.) The 37-core tape-like wire 5 of the same size permits the reduction of manufacturing steps for the oxide superconducting multi-core wire 6 and also permits cost reduction.

The bismuth-based oxide superconductor is characterized in that its crystal grains grow, upon heating, in the direction perpendicular to the c axis. Consequently, it decreases in critical current in a magnetic field parallel to the c axis. If the 37-core tape-like wire 5 is arranged in rotational symmetry, it is possible to prevent the critical current from decreasing irrespective of the direction in which a magnetic field is applied.

(13) The third pure silver (Ag) pipe, in which the 37-core tape-like wire 5 has been packed, is then drawn until the outside diameter of the pipe is reduced to 0.75 to 2.5 mm. Thus, there is obtained the oxide superconducting multi-core wire 6. The third pure silver (Ag) pipe becomes the silver sheath 1; the first silver pipe and the second silver pipe become the silver sheath 10; and the oxide superconductor packed in the first silver pipe becomes the oxide filament 9.

The oxide filament 9 has a desired thickness and aspect ratio if the tape-like wire is selected adequately. Drawing and rolling give the wire the desired cross section and densify the oxide filament 9. Incidentally, if rolling is carried out so as to promote extension in the widthwise direction while minimizing elongation in the lengthwise direction, it is possible to densify the oxide filament 9 even more.

Figure 10:
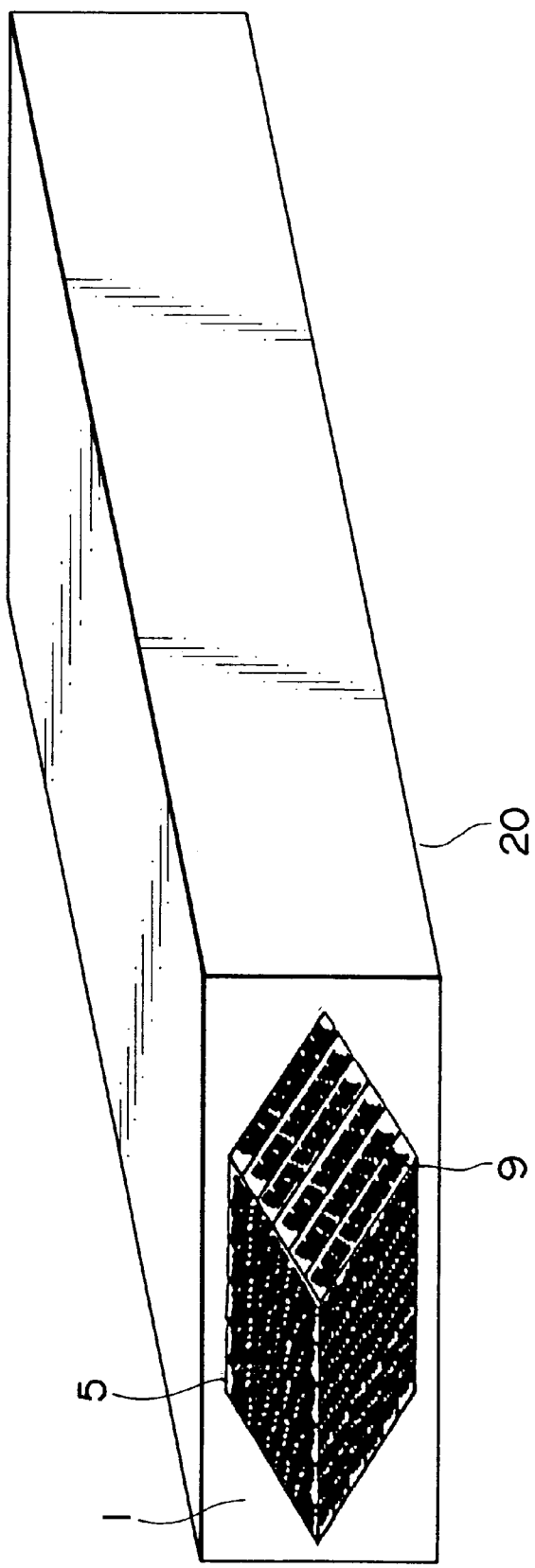
FIG. 10 is a diagram showing the oxide superconducting multi-core wire 20 in rectangular form.

The oxide superconducting multi-core wire 6 optionally undergoes rolling or drawing through a cassette roller die so as to provide the oxide superconducting multi-core wire 11 which has a rectangular cross section as shown in FIG. 10.

Then, the oxide superconducting multi-core wire 6 undergoes heat treatment so as to impart superconductivity.

(14) The oxide superconducting multi-core wire 6 is placed in pure oxygen (with an oxygen partial pressure of 1 atm) and heated at 875 to 900° C. for 5 to 60 minutes. This temperature is slightly higher than the decomposition temperature of the oxide superconductor ($Bi_2Sr_2Ca_1Cu_2O_x$ in this example) of the oxide filament 9. This heat treatment brings about partial melting of the oxide superconductor. After heat treatment, the wire is cooled to room temperature. Thus, the oxide superconducting multi-core wire 6 is given superconductivity.

The wire undergoes optional annealing at 800 to 840° C. for 5 to 50 hours in an atmosphere containing 1 to 20% oxygen (with an oxygen partial pressure of 0.01 to 0.2 atm). This temperature is slightly lower than the decomposition temperature of the oxide superconductor.

In this example, the oxide superconductor having the composition of $Bi_2Sr_2Ca_1Cu_2O_x$ is made from a raw material powder composed of bismuth (Bi) compound, strontium (Sr) compound, calcium (Ca) compound, and copper (Cu) compound. However, the raw material powder may additionally contain a lead (Pb) compound and/or barium (Ba) compound, if necessary. These compounds may be in the form of oxide, hydroxide, carbonate, nitrate, borate, and acetate. The technology of this example may be applied to oxide superconductors of any other type than the bismuth (Bi) type, such as thallium (Tl)-type superconductor and mercury (Hg) type superconductor.

The metal sheath material should preferably be silver or silver alloy which resists corrosion during heat treatment. Silver may be alloyed with gold (Au), antimony (Sb), platinum (Pt), magnesium (Mg), titanium (Ti), manganese (Mn), nickel (Ni), copper (Cu), aluminum (Al), etc.

The preparation of the oxide superconducting powder and the heat treatment for intermediate firing should be carried out at 700 to 950° C. The composition of $Bi_2Sr_2Ca_1Cu_2O_x$ may be incorporated with or replaced with a third element according to need. The resulting oxide superconductor is heated at a temperature at which it partly melts. In the cooling step, non-superconducting phases are dispersed into the crystal grains of the superconducting phase. This enhances the pinning effect.

In this example, the oxide superconducting multi-core wire 6 is formed by a "powder-in-tube" method; however, it is possible to employ a "rod-in-tube" method, a doctor blade method, a dip coating method, a spray pyrolysis method, a screen printing method, or a jelly roll method.

The oxide superconducting multi-core wire 6 produced as mentioned above was tested for superconductivity.

(Results of Measurement 1)

The oxide superconducting multi-core wire 6, with the oxide filament 9 varying in average thickness from 1.5 $\mu$m to 40 $\mu$m, was tested for critical current density (Jc) at 4.2 K in the absence of an applied magnetic field. The results are shown in Table 2.

TABLE 2

| Average thickness of oxide filament ($\mu$m) | 1.5 | 2.5 | 3 | 5 | 10 | 15 | 20 | 25 | 40 |
|---|---|---|---|---|---|---|---|---|---|
| Jc (at 4.2 K., 0 T) (A/mm$^2$) | 150 | 185 | 230 | 245 | 235 | 260 | 248 | 190 | 180 |

It is noted that the critical current density (Jc) is as high as 230 to 260 A/mm$^2$ if the oxide filament 9 has an average thickness of 3 to 20 $\mu$m. However, Jc decreases if the average thickness is smaller than 3 $\mu$m or larger than 25 $\mu$m.

This result suggests that the critical current density (Jc) can be made high if the oxide filament 9 has an average thickness in the range of 3 to 20 μm.

(Results of Measurement 2)

The oxide superconducting multi-core wire 6, with the oxide filament 9 varying in thickness accounting for more than 50%, was tested for critical current density (Jc). The results are shown in FIG. 11.

Figure 11:
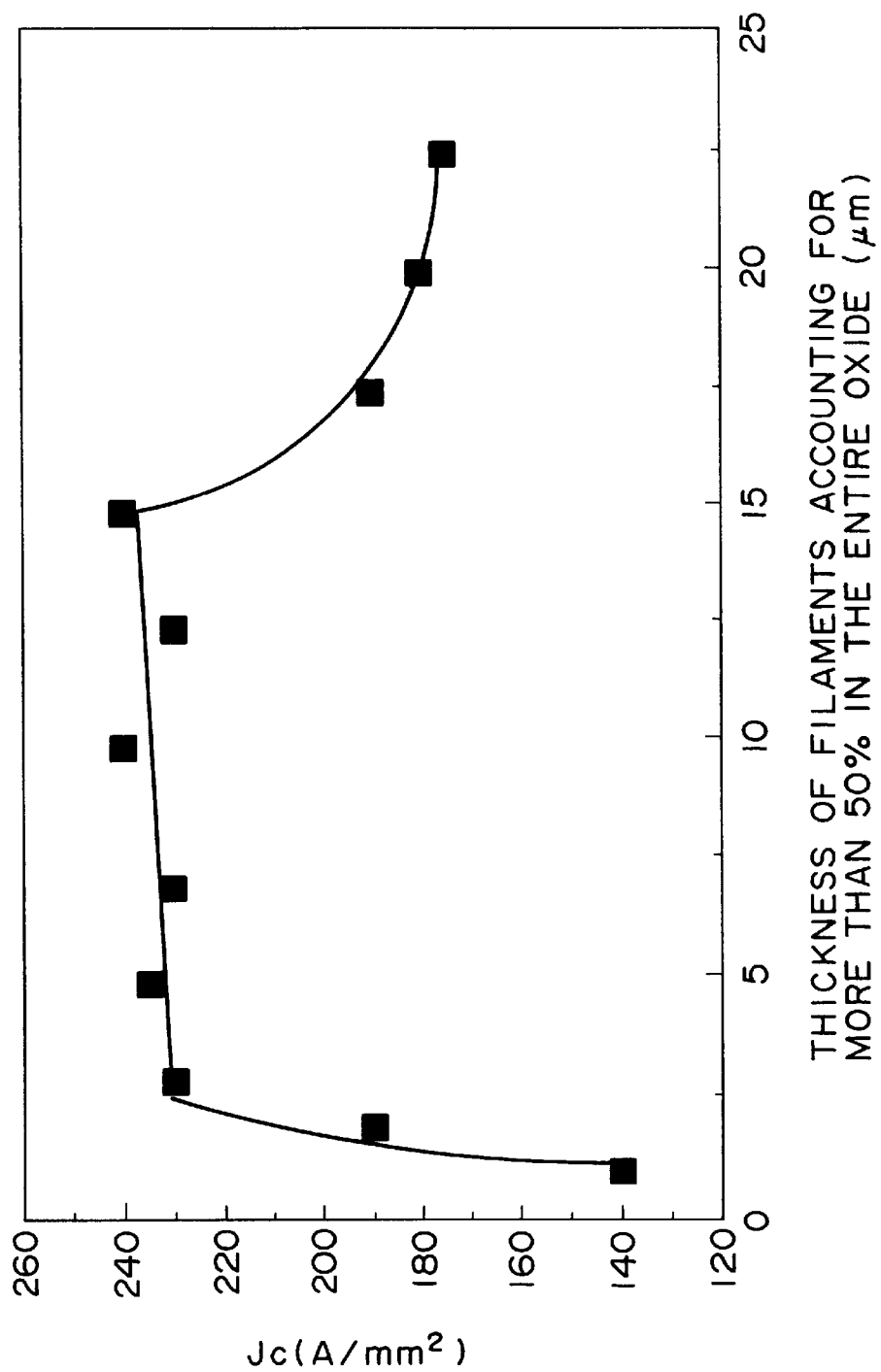
FIG. 11 is a graph showing the relation between the thickness of the oxide filament 9 and the critical current density (Jc)

It is noted from FIG. 11 that the oxide superconducting multi-core wire 6 invariably gives a critical current density (Jc) of 230 A/mm$^2$ if more than 50% of oxide filament 9 is in the range of 3 to 15 μm.

(Results of Measurement 3)

The oxide superconducting multi-core wire 6, with the oxide filament 9 varying in aspect ratio from 1 to 20, was tested for critical current density (Jc) at 4.2 K in the absence of an applied magnetic field. The results are shown in Table 3. The aspect ratio is the ratio of the vertical side to the horizontal side of the oxide filament 9.

Figure 12:
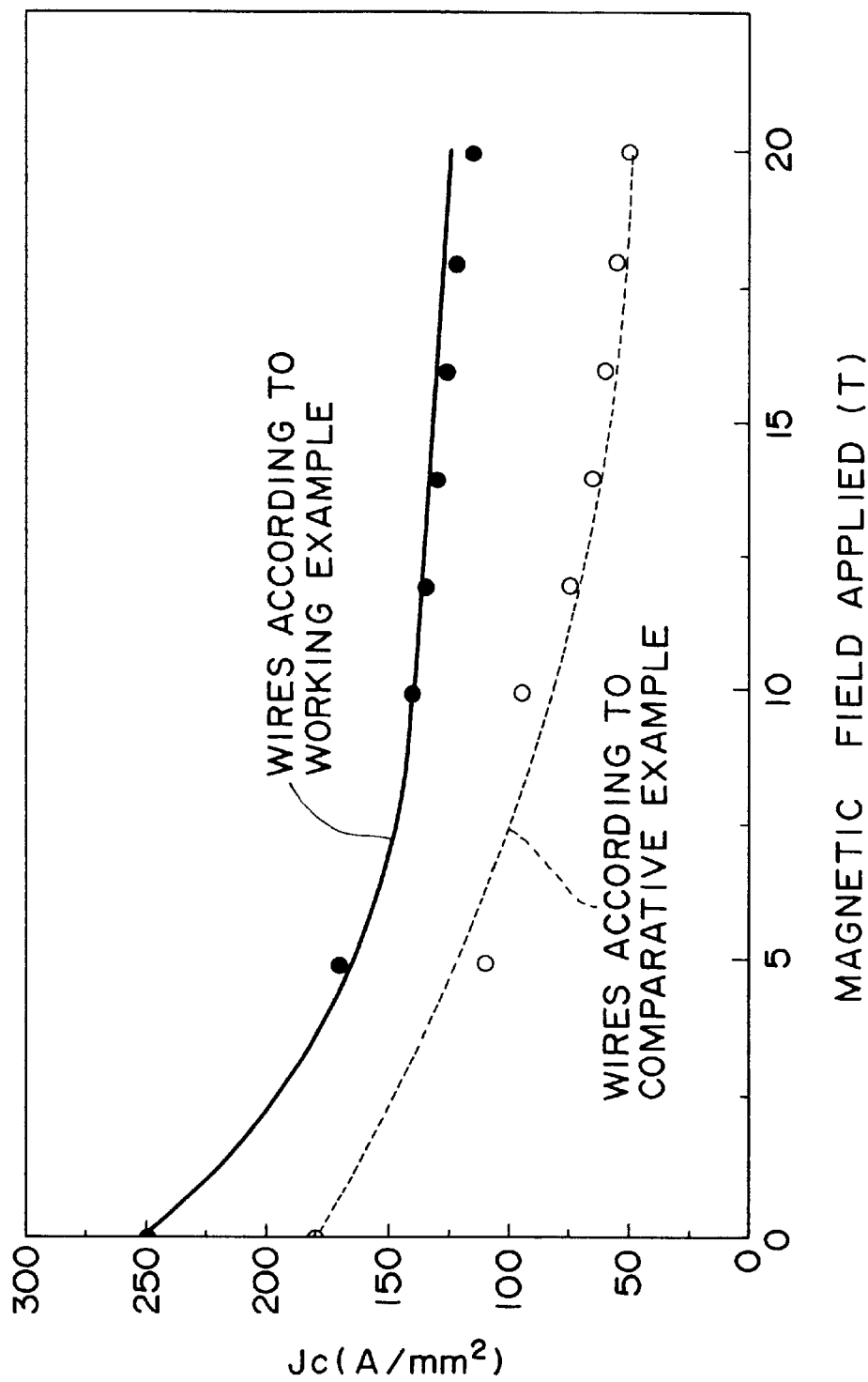
FIG. 12 is a graph showing the dependence on magnetic field of the critical current density (Jc) of the oxide superconducting multi-core wire 6.

It is noted from FIG. 12 that the oxide superconducting multi-core wire 6 gives a critical current density (Jc) of 250 A/mm$^2$ at 4.2 K in the absence of an applied magnetic field, whereas the comparative wire gives a Jc of 180 A/mm$^2$. Also, the oxide superconducting multi-core wire 6 gives a critical current density (Jc) of 125 A/mm$^2$ at 4.2 K in the presence of a magnetic field of 20T, whereas the comparative wire gives a Jc of 40 A/mm$^2$. These results suggest that the oxide superconducting multi-core wire 6 gives a higher critical current density (Jc) than the comparative wire in the presence of an applied magnetic field.

(Results of Measurement 6)

Figure 13:
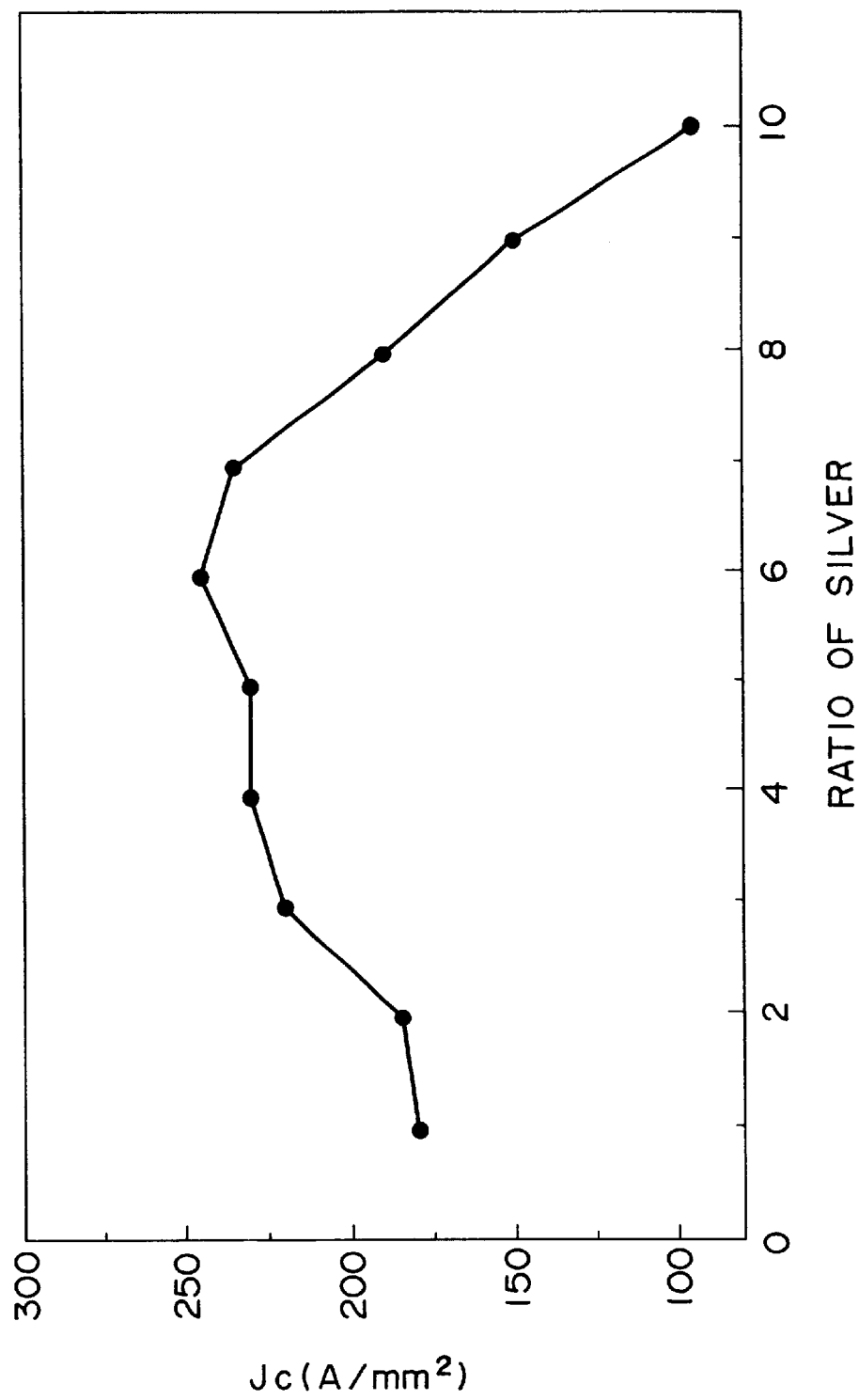
FIG. 13 is a graph in which the critical current density (Jc) is plotted against the silver (Ag) ratio in the oxide superconducting multi-core wire 6.

The oxide superconducting multi-core wire 6, with the ratio of silver (Ag) therein varied, was tested for critical current density (Jc). The results are shown in FIG. 13. The ratio of silver (Ag) is expressed in terms of the ratio of silver (As) as the metal matrix to the oxide filament 9 in the cross section of the oxide superconducting wire 4. In FIG. 13, the vertical axis represents the critical-current density (Jc) in

TABLE 3

| Average aspect ratio of oxide filament | 1 | 1.5 | 2 | 2.5 | 5 | 7.5 | 10 | 12.5 | 20 |
|---|---|---|---|---|---|---|---|---|---|
| Jc (at 4.2 K., 0 T) (A/mm$^2$) | 150 | 185 | 225 | 245 | 225 | 230 | 240 | 190 | 190 |

It is noted that the critical current density (Jc) is as high as 225 to 245 A/mm$^2$ if the oxide filament 9 has an average aspect ratio in the range of 2 to 10. However, Jc decreases if the average aspect ratio is outside this range.

This result suggests that the critical current density (Jc) can be made high if the oxide filament 9 has an average aspect ratio in the range of 2 to 10 μm.

In addition, the oxide superconducting multi-core wire 6 invariably gives a critical current density (Jc) higher than 200 A/mm$^2$ if more than 90% of the oxide filaments 9 have an aspect ratio in the range of 2 to 10.

(Results of Measurement 4)

The rectangular oxide superconducting multi-core wire 20, with its aspect ratio varying from 1 to 30, was tested for critical current density (Jc) at 4.2 K in the absence of magnetic field applied. The results are shown in Table 4.

A/mm$^2$ at 4.2 K in the absence of an applied magnetic field, and the horizontal axis represents the ratio of silver.

It is noted from FIG. 13 that the critical current density (Jc) at 4.2 K in the absence of an applied magnetic field is 220 to 245 A/mm$^2$ if the ratio of silver is in the range of 3 to 7, whereas it decreases if the ratio of silver is outside this range.

The results mentioned above suggest that it is possible to increase the critical current density (Jc) when the ratio of silver (Ag) in the oxide superconducting multi-core wire 6 is in the range of 3 to 7.

(Results of Measurement 7)

The oxide superconducting multi-core wire 6 having a round cross section and the oxide superconducting multi-core wire 20 having a rectangular cross section, with their sectional area varied, were tested for critical current density

TABLE 4

| Average aspect ratio | 1 | 2 | 4 | 5 | 6 | 8 | 12 | 16 | 20 |
|---|---|---|---|---|---|---|---|---|---|
| Jc (at 4.2 K., 0 T) (A/mm$^2$) | 220 | 225 | 235 | 245 | 250 | 240 | 250 | 245 | 245 |

It is noted that the critical current density (Jc) is as high as 220 to 250 A/mm$^2$ if the aspect ratio is in the range of 1 to 15. However, Jc decreases if the aspect ratio exceeds 6. Moreover, the oxide superconducting multi-core wire 6 is liable to breakage during fabrication into a rectangular shape if its aspect ratio exceeds 6.

Therefore, the oxide superconducting multi-core wire 20 should have an aspect ratio in the range of 1 to 10.

(Results of Measurement 5)

The oxide superconducting multi-core wire 6 was tested for the dependence of critical current density (Jc) on the intensity of an applied magnetic field. The results are shown in FIG. 12. The solid line represents the oxide superconducting multi-core wire 6 of the working example, and the dotted line represents the oxide superconducting multi-core wire for comparison in which the oxide filament 9 is made round instead of tape-like.

Figure 14:
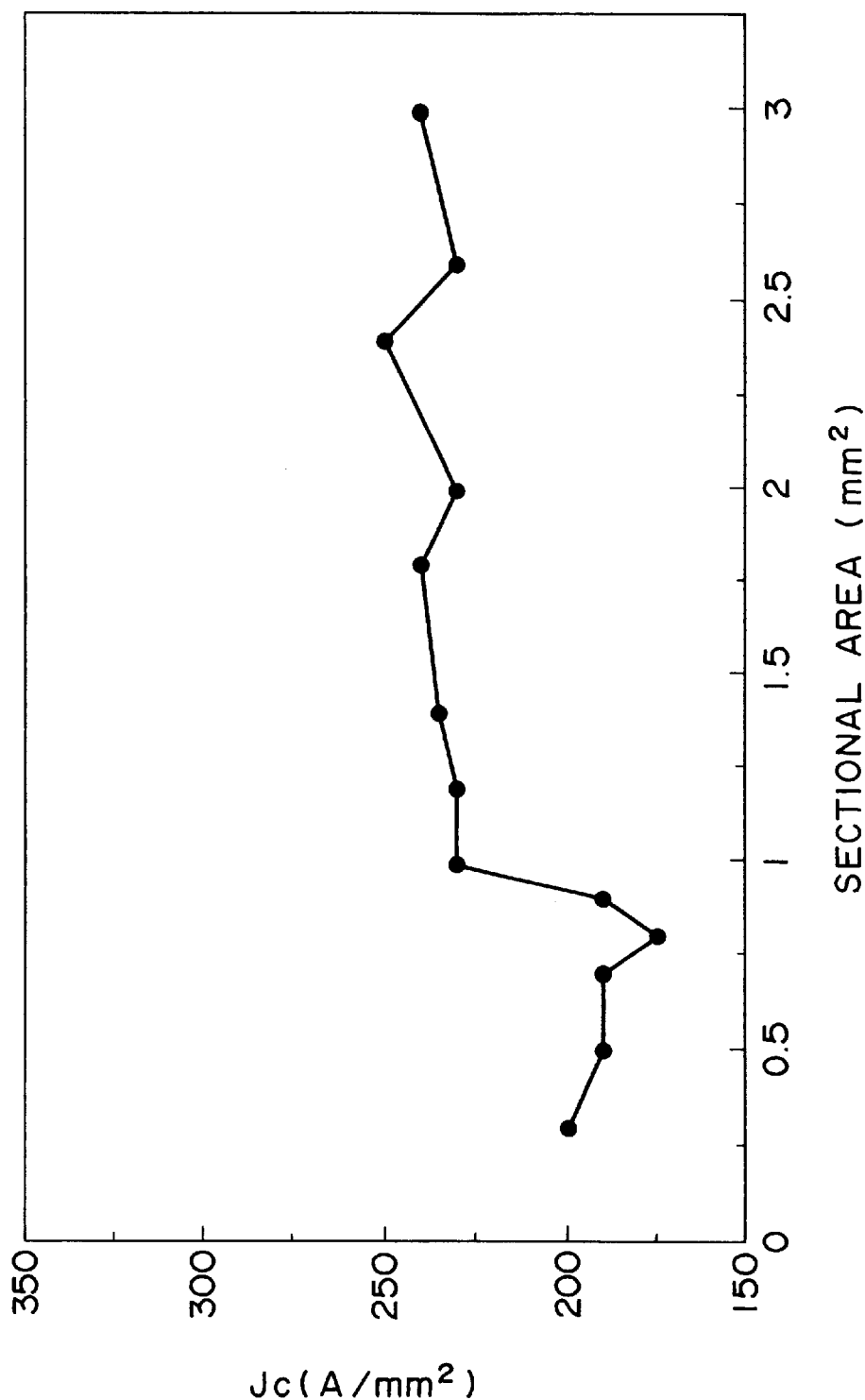
FIG. 14 is a graph in which the critical current density (Jc) is plotted against the sectional area of the oxide superconducting multi-core wire 6 and the oxide superconducting multi-core wire 20.

(Jc). The results are shown in FIG. 14. It is noted from FIG. 14 that the critical current density (Jc) at 4.2 K in the absence of an applied magnetic field is lower than 200 A/mm$^2$ if the sectional area is smaller than 1 mm$^2$, whereas the critical current density (Jc) is higher than 230 A/mm$^2$ if the sectional area is larger than 1 mm$^2$.

The results mentioned above suggest that it is possible to increase the critical current density (Jc) when the oxide superconducting multi-core wire has a sectional area larger than 1 mm$^2$.

(Results of Measurement 8)

The oxide superconducting multi-core wire 6 was tested for the distribution of the critical current density (Jc) in the lengthwise direction at 4.2 K in the absence of an applied magnetic field, with the average particle diameter of the superconducting powder packed into the first pure silver (Ag) pipe varied (3, 1, 3, 4.5, and 6 μm). The voltage terminals are 30 mm apart. The results are shown in FIG. 15.

Figure 15:
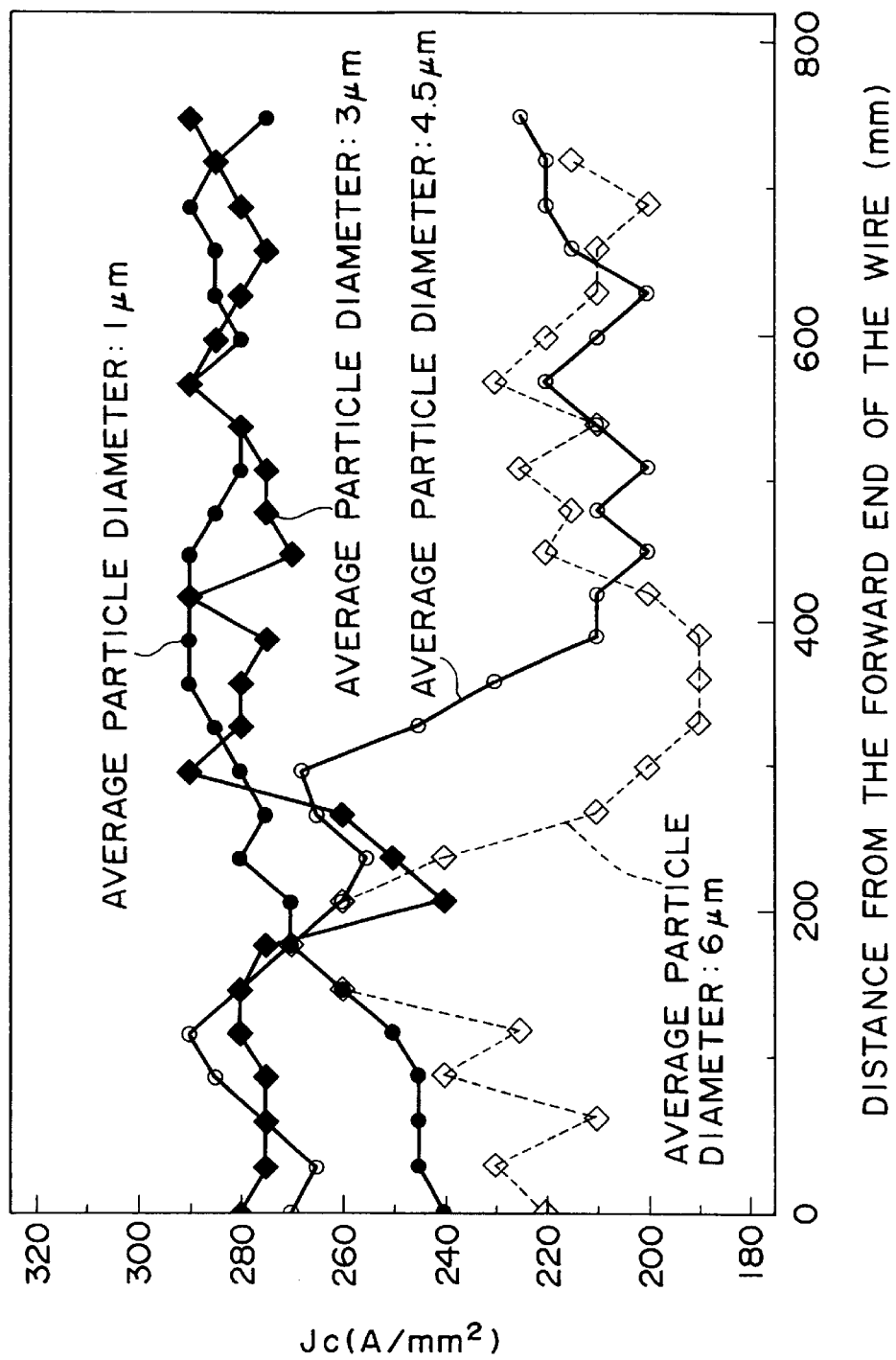
FIG. 15 is a graph showing the distribution of the critical current density (Jc) which varies depending on the average particle diameter (1, 3, 4.5, and 6 $\mu$m) of the superconducting powder.
Figure 16:
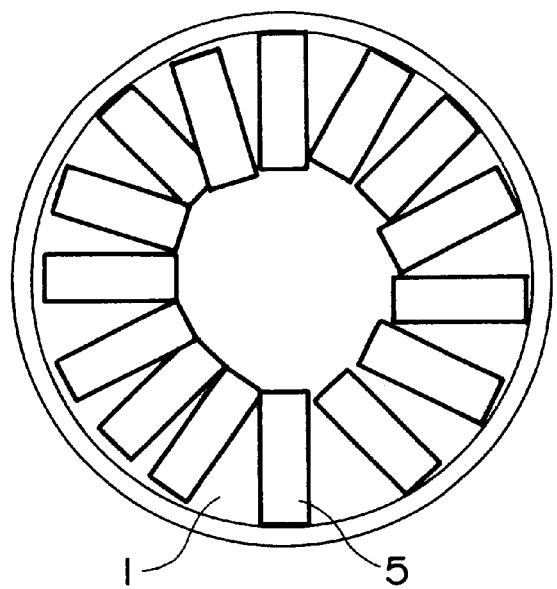
FIGS. 16 to 22 are diagrams showing the cross section of other oxide superconducting multi-core wires.
Figure 17:
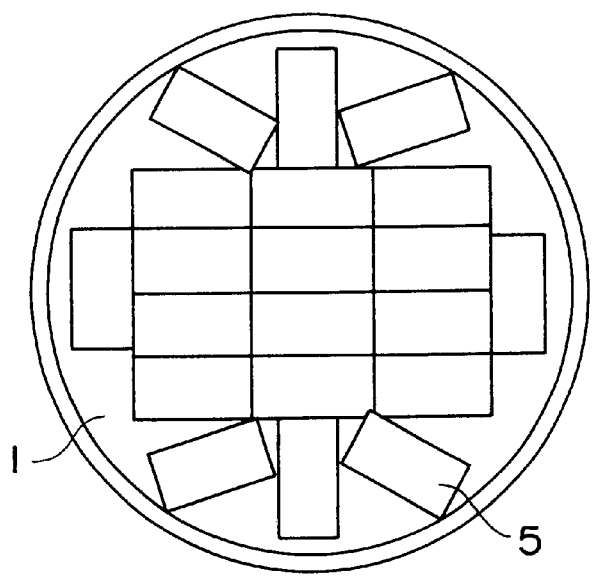

It is noted from FIG. 15 that the distribution of the critical current density (Jc) becomes wider and uneven as the particle diameter of the superconducting powder increases. To be more specific, in the case where the average particle diameter of the superconducting powder is 6 μm, the critical current density (Jc) fluctuates between 270 A/mm$^2$ and 190 A/mm$^2$. In the case where the average particle diameter of the superconducting powder is 4.5 μm, the critical current density (Jc) fluctuates between 290 A/mm$^2$ and 200 A/mm$^2$. In the case where the average particle diameter of the superconducting powder is 1 μm or 3 μm, the critical current density (Jc) fluctuates between 240 A/mm$^2$ and 290 mm$^2$. In the last case, the critical current density (Jc) is high and uniform.

The cross section of the oxide superconducting multi-core wire 6 was observed under a scanning electron microscope. It was found that non-superconducting phase becomes coarser as the average particle diameter of the superconducting powder becomes larger. It is considered that the coarse non-superconducting phase interrupts the current flow, thereby decreasing the critical current density (Jc).

For the reasons mentioned above, it is desirable that the superconducting powder to be packed into the first metal pipe should be crushed to such an extent that its average particle diameter is smaller than 3 μm. A superconducting powder having an average particle diameter smaller than 3 μm gives the long oxide superconducting multi-core wire 6 which is comparable in current flow characteristics to the conventional tape-like oxide superconducting wire.

In this example, the hexagonal core 8 is formed from three segments 7 arranged in rotational symmetry, each segment consisting of 37-core tape-like wire 5 laminated on top of each other. The arrangement of the 37-core tape-like wire 5 may be modified as shown in FIGS. 16 to 22. The illustrated laminate structure permits the oxide filaments 9 to orient in various directions, so that the resulting wire is less anisotropic and keeps the critical current high irrespective of the direction of the magnetic field. The tape-like wires may be arranged closely as shown in FIGS. 2 to 5.

Figure 18:
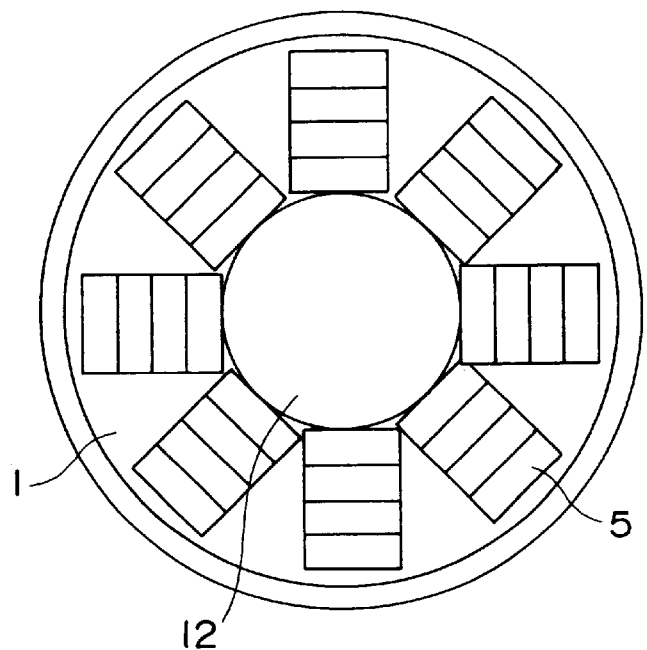
Figure 19:
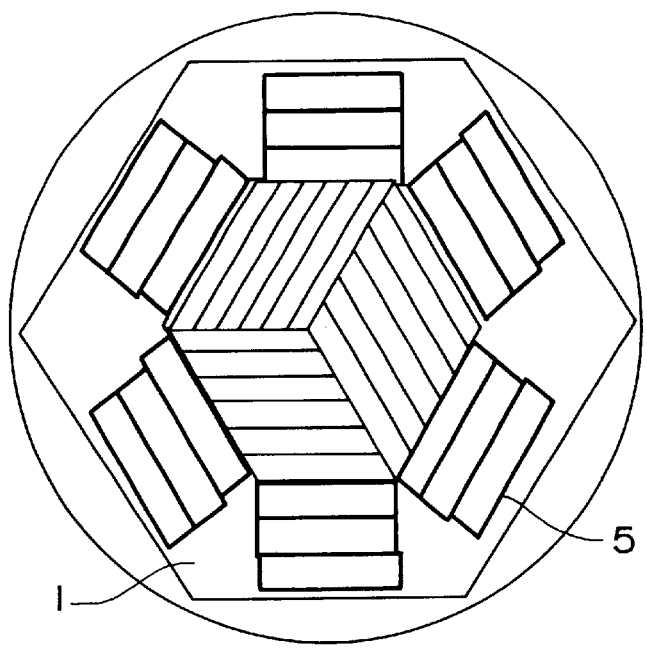
Figure 20:
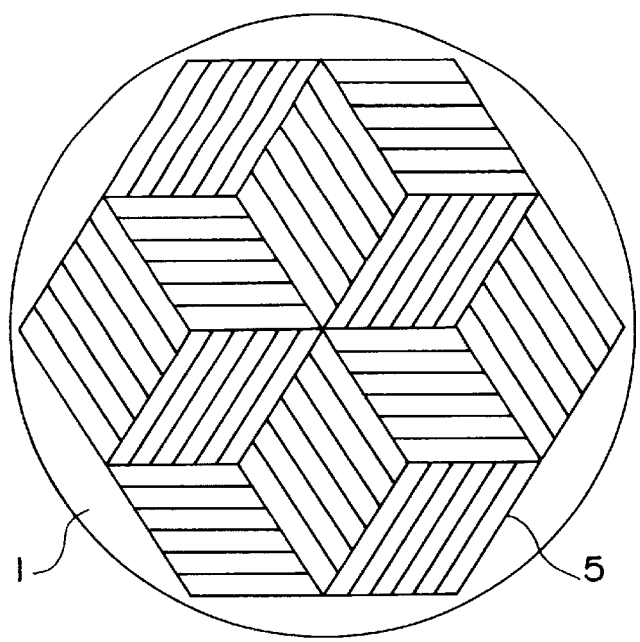
Figure 21:
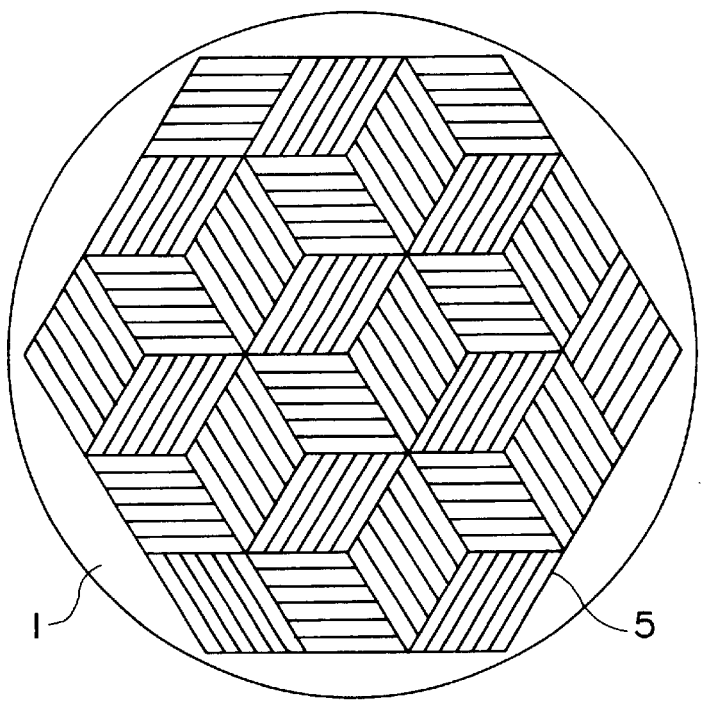
Figure 22:
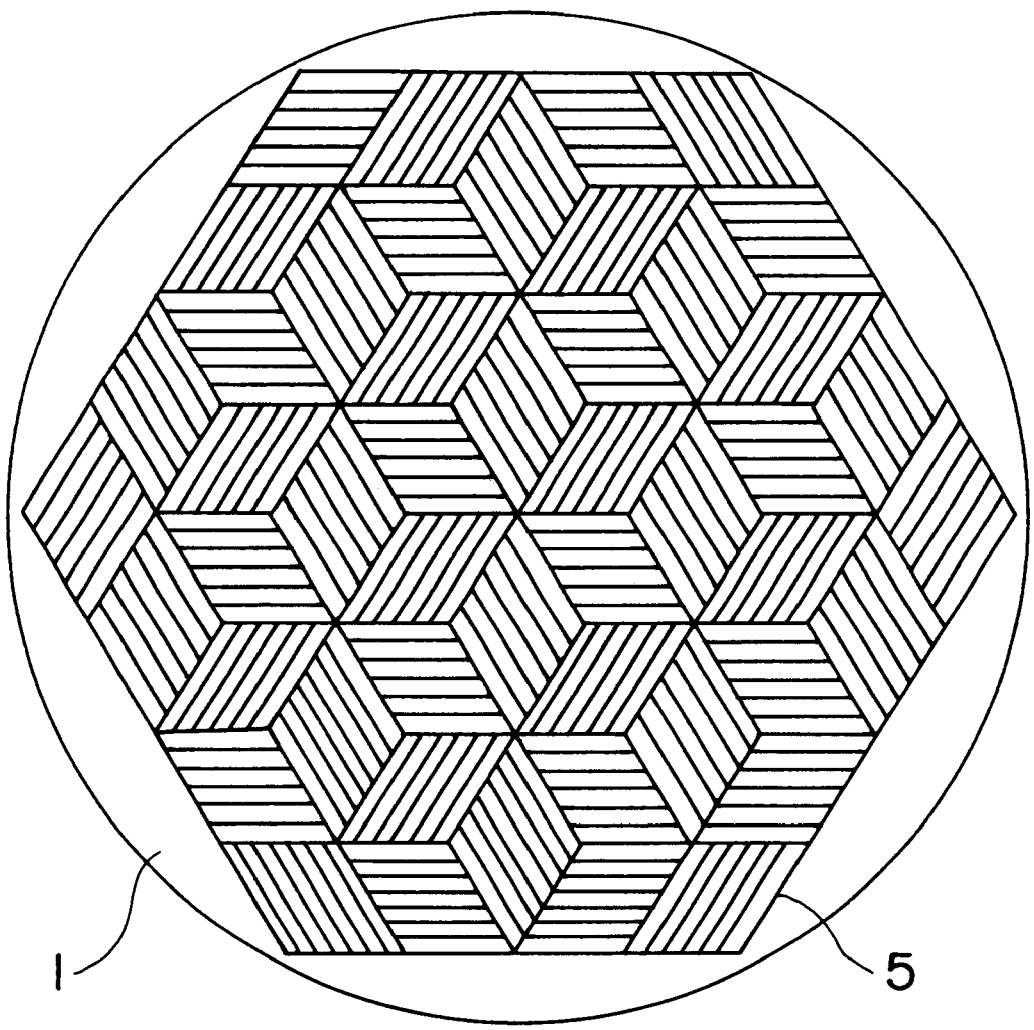

Another arrangement is shown in FIG. 18. A fourth metal pipe or metal wire 12 (of silver or silver alloy) is placed at the center of the oxide superconducting multi-core wire 6. This metal pipe or wire 12 in place of the oxide filament 9 does not greatly change the critical current (Jc), because the oxide filament 9 placed at the center of the oxide superconducting multi-core wire 6 is less dense than the oxide filament 9 placed at the surface even though after rolling. In fact, no significant difference in critical current density (Jc) was observed irrespective of the oxide filament 9 and the metal pipe or wire 12. In addition, the fourth metal pipe contributes to mechanical strength and uniform cross section. When the oxide superconducting multi-core wire 6 is twisted for the production of twisted conductor, the center is not virtually twisted; therefore, it is not concerned with the reduction of AC loss and it is not necessarily an oxide filament 9.

The inside of the third metal pipe is not necessarily required to be round; it may be polygonal so that the 37-core tape-like wire 5 is packed more densely. A hexagonal cross section is most suitable for densest packing and regular sectional shape.

The above-mentioned oxide superconducting multi-core wire will be widely used for superconducting apparatuses exemplified below to increase their efficiency. Examples are a power transmitting cable, bus bar, long conductor, permanent current switching element, large magnet, NMR analyzer, medical NMR diagnosing apparatus, superconducting electric power storing apparatus, magnetic separating apparatus, apparatus for pulling up a single crystal in a magnetic field, cryogenic superconducting magnet, superconductive energy storage, superconducting generator, magnet for nuclear fusion reactor, accelerator, current lead, and current limiting relay.

The oxide superconducting multi-core wire of the present invention may be cooled with liquid helium as well as liquid nitrogen or a freezer. Therefore, it helps reduce the running cost of the apparatus and merely needs simple provisions to prevent quench (rapid transition from superconducting state to normal conducting state, leading to destruction). In addition, it improves the reliability of superconductivity.

EXAMPLE 8

Figure 23:
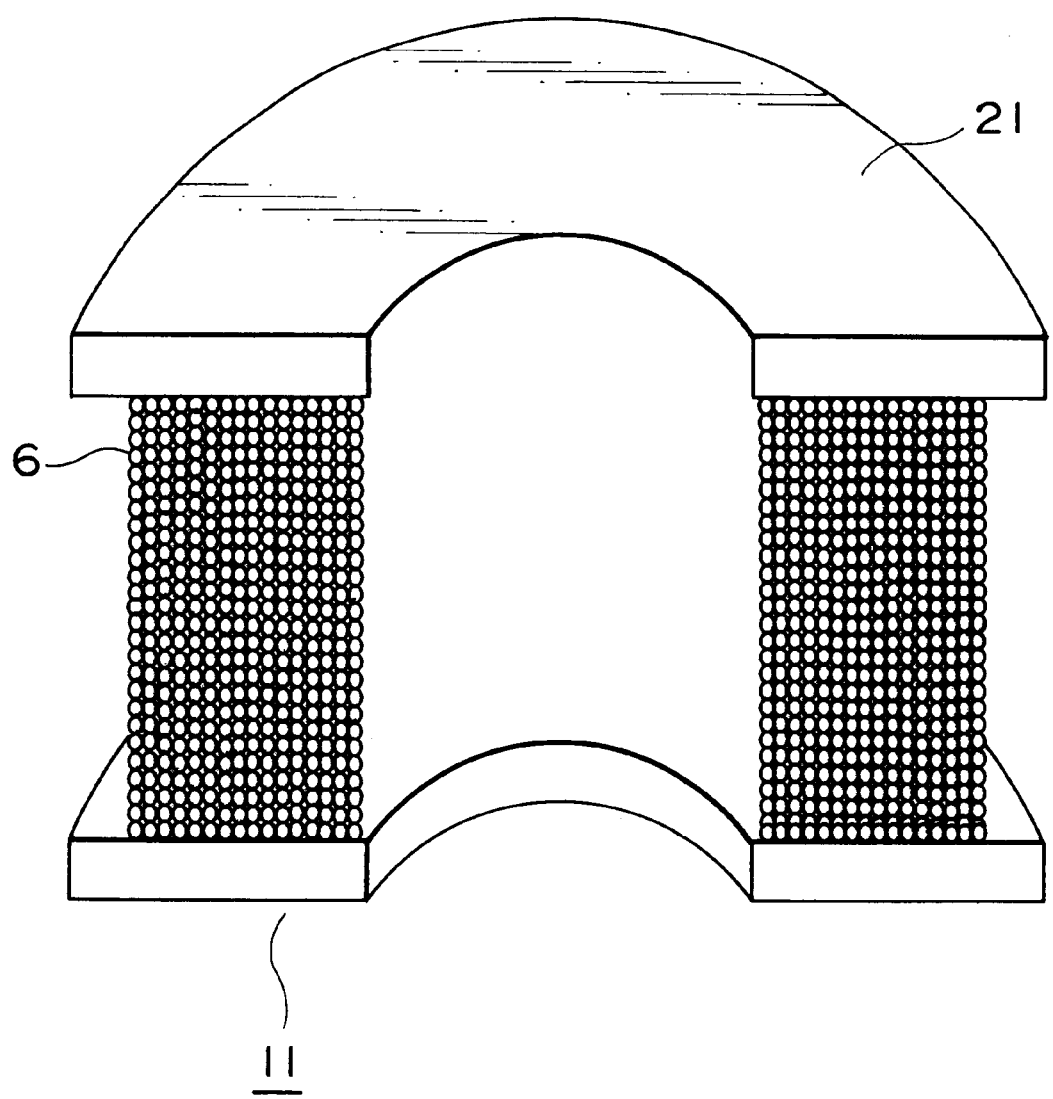
FIG. 23 is a diagram showing the solenoid coil 13 representing an eighth example of the present invention.

This example demonstrates a solenoid coil shown in FIG. 23. The solenoid coil 11 (35 mm in inside diameter, 70 mm in outside diameter, and 150 mm in height) consists of a bobbin 6 of heat resistant metal and an oxide superconducting multi-core wire 6 having a round cross section (1.5 mm in diameter) which is wound around the bobbin. This solenoid coil was heated at 890° C. for 10 minutes so that the oxide superconductor partly melts. (This heating temperature is slightly higher than the decomposition temperature of the oxide superconductor having a composition of $Bi_2Sr_2Ca_1Cu_2O_x$.) Upon cooling to room temperature, the solenoid coil exhibited superconductivity. For enhancement of superconductivity, the solenoid coil underwent annealing at 800° C. for 50 hours in an atmosphere containing 10% oxygen.

The solenoid coil 11 was tested for excitation in an external magnetic field of 20T. It generated a magnetic field of 1.5T. The uniformity of magnetic field measured for the coil alone was 0.005 ppm at 20 mmφ). In other words, it achieved a very high uniformity of magnetic field.

Figure 24:
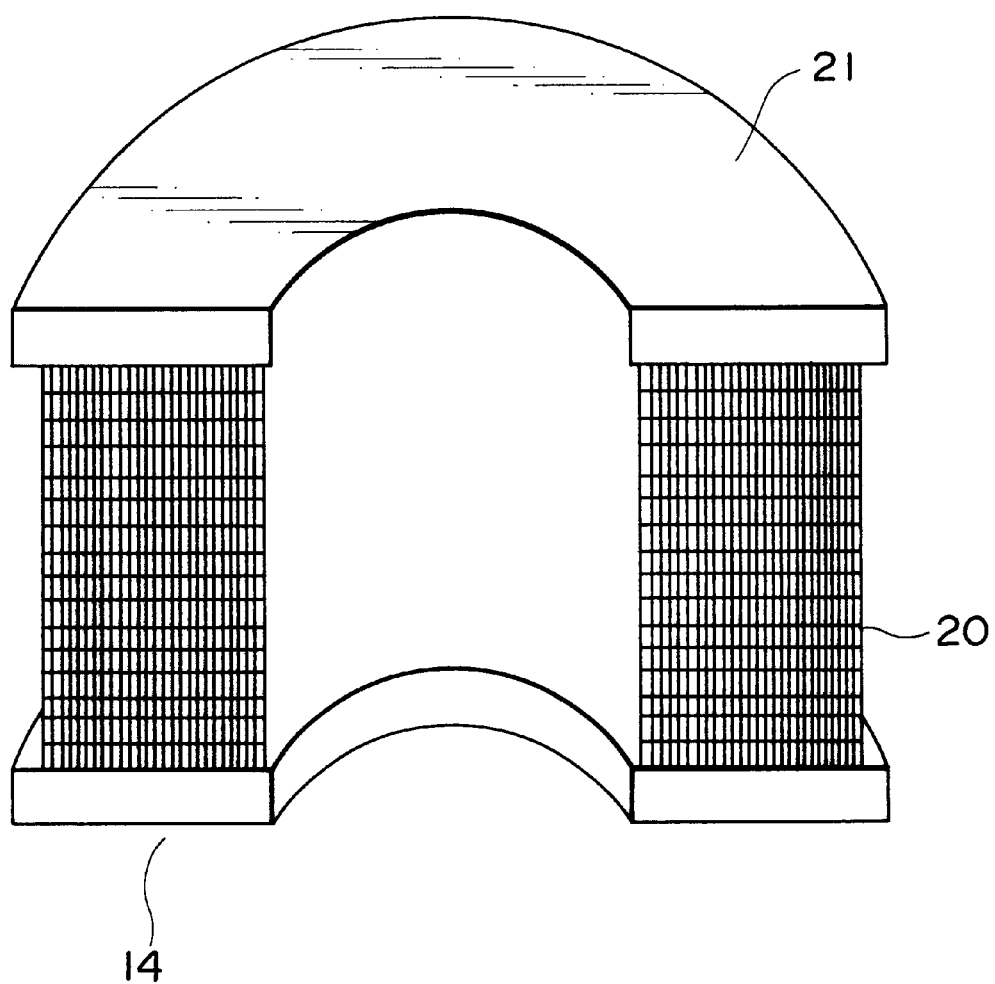
FIG. 24 is a diagram showing the solenoid coil 14.

FIG. 24 shows a solenoid coil 14 (35 mm in inside diameter, 70 mm in outside diameter, 150 mm in height), which consists of a bobbin 21 of heat resistant metal and an oxide superconducting multi-core wire 20 having a rectangular cross section, 1.1 mm thick and 2.2 mm wide, wound around the bobbin. The solenoid coil 14 underwent heat treatment in the same way as the solenoid coil 13 so that it exhibited superconductivity.

The solenoid coil 12 was tested for excitation in an external magnetic field of 20T. It generated a magnetic field of 1.7T. The uniformity of magnetic field measured for the coil alone was 0.007 ppm at 20 mmφ. In other words, it achieved a very high uniformity of magnetic field which was not achieved by the conventional laminated pancake coil.

The oxide superconducting multi-core wire 6 having a round cross section or the oxide superconducting multi-core wire 20 having a rectangular cross section can be produced easily with higher accuracy than conventional tape-like oxide superconducting wires. Therefore, the solenoid coils 13 and 14 made from them can be made more accurately in the axial and circumferential directions than the pancake coil made from conventional tape-like oxide superconducting wires. Therefore, the solenoid coils 11 and 14 can be applied to the high-resolution NMR magnet which needs a strong, uniform magnetic field.

According to the present invention, it is possible to provide an oxide superconducting wire which has good accuracy of outer shape and is capable of generating a strong, uniform magnetic field at a high critical current density (Jc), and it is also possible to provide a solenoid coil and a magnetic field generating apparatus made therefrom.

According to the present invention, the oxide superconducting wire is composed of multi-core tape-like wires which are arranged in rotational symmetry. Therefore, the critical current is prevented from decreasing irrespective of the direction in which the magnetic field is applied. In addition, it has a high critical current density (Jc) because the oxide superconducting filament has an optimal size.

If a metal sheath of silver or silver alloy is used and the ratio of the metal sheath to the oxide superconducting filament is larger than 3 and smaller than 7, it is possible to increase the critical current density Jc) more.

In the case of oxide superconducting wire having a rectangular cross section, the aspect ratio of the cross section should preferably be larger than 1 and smaller than 6.

If the oxide superconducting wire is made from an oxide superconductor or a raw material of oxide superconductor in the form of powder having an average particle diameter smaller than 3 $\mu$m, it is possible to obtain a long oxide superconducting wire which is comparable in current flowing characteristics to conventional tape-like oxide superconducting wires.

Solenoid coils made from the oxide superconducting wire of the present invention generate a strong, uniform magnetic field.

The oxide superconducting wire of the present invention has good accuracy of outer shape and generates a high critical current density; therefore, it can be used for apparatuses requiring a strong, uniform magnetic field, such as scientific instruments, NMR analyzers, and medical MRI apparatuses.

What is claimed is:

1. An oxide superconducting wire composed of a metal sheath and a core formed as an assembly of oxide superconducting filaments, characterized in that the core is formed of multi-core tape wires, each consisting of said oxide superconducting filaments which are laminated on top of each other to form units having a rhombic shape in a cross section perpendicular to a lengthwise direction of the wire, and the units arranged in rotational symmetry, said oxide superconducting filaments having a cross section such that the average thickness is 3 to 20 $\mu$m and the average aspect ratio is larger than 2 and smaller than 10.

2. An oxide superconducting wire as defined in claim 1, wherein the oxide superconducting filament contains a bismuth-based oxide superconductor.

3. An oxide superconducting wire as defined in claim 1, wherein the oxide superconducting filament contains the superconducting phase of the composition of $Bi_2Sr_2Ca_1Cu_2O_x$.

4. An oxide superconducting wire as defined in claim 1, wherein the metal sheath is a silver sheath or a silver alloy sheath and the ratio of the metal sheath in the cross section perpendicular to the lengthwise direction is larger than 3 and smaller than 7 with respect to the oxide superconducting filament.

5. An oxide superconducting wire as defined in claim 1, wherein the outer shape of the wire is rectangular and the aspect ratio of the vertical side to the horizontal side of the cross section perpendicular to the lengthwise direction is larger than 1 and smaller than 6.

6. A solenoid coil which is constructed of the oxide superconducting wire defined in claim 1.

7. An oxide superconducting wire which is characterized in that the wire has an approximately round cross section perpendicular to its lengthwise-direction, the cross section is composed of several units, each unit being composed of a plurality of elements in the form of tape-shaped oxide superconductors which are laminated stepwise on top of each other in the direction perpendicular to the lengthwise direction at an angle of about 60 degrees with respect to the element surface within said cross section, said unit having an approximately rhombic shape within said cross section, said cross section having at least three different units which are arranged such that adjacent units have a rotational symmetry at about 120 degrees with respect to the direction of tape lamination and at least one side of a unit of rhombic shape is in contact with an adjacent unit.

8. An oxide superconducting wire with a round cross section which, in its cross section perpendicular to its lengthwise direction, is composed of three units, each unit consisting of laminated elements in the form of tape-shaped oxide superconductors, the assembly of said units being concentrated to form the closest-packed shape at the center of the cross section, with all the elements having at least one end thereof in contact with a sheathing material constituting the periphery of the wire.

9. An oxide superconducting wire as defined in claim 7 or 8, wherein the tape-shaped oxide superconductor is composed of multi-core wires.

10. An oxide superconducting wire as defined in claim 7 or 8, wherein the tape-shaped oxide superconductor is composed of multi-core wires and is twisted.

11. An oxide superconducting wire as defined in claim 7 or 8, wherein the tape-shaped oxide superconductor is composed of multi-core wires and is twisted and the tapes are separated by a high-resistance layer interposed between the tapes.

12. An oxide superconducting wire as defined in claim 7 or 8, wherein the tape-shaped oxide superconductor is composed of multi-core wires and is twisted and the tapes and units are separated by a high-resistance layer interposed between the tapes and the wire is twisted.

13. An oxide superconducting wire as defined in claim 7 or 8, wherein the superconductor is $Bi_2Sr_2Ca_1Cu_2O_x$.

14. An oxide superconducting wire characterized in that the cross section of the wire is round and is composed of several units, each consisting of elements in the form of tape-shaped superconductors laminated in an approximately rhombic shape, said units being arranged such that they form a hexagon as a whole.

15. A solenoid coil which is constructed of the oxide superconducting wire defined in any one of claims 7, 8 and 14.

16. A magnetic field generating apparatus which is constructed of the oxide superconducting wire defined in any one of claims 7, 8 and 14.

17. An oxide superconducting wire as defined in any one of claims 7, 8 and 14, wherein the elements have an average aspect ratio larger than 2 and smaller than 10.

* * * * *